(12) United States Patent
Shimizu et al.

(10) Patent No.: US 8,925,187 B2
(45) Date of Patent: *Jan. 6, 2015

(54) SYSTEM FOR MOUNTING COMPONENTS ON BOARDS

(71) Applicant: Fuji Machine Mfg. Co., Ltd., Chiryu (JP)

(72) Inventors: Kouji Shimizu, Chiryu (JP); Seiichi Terui, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/855,465

(22) Filed: Apr. 2, 2013

(65) Prior Publication Data

US 2013/0212876 A1    Aug. 22, 2013

Related U.S. Application Data

(62) Division of application No. 13/477,690, filed on May 22, 2012, now abandoned, which is a division of application No. 12/613,129, filed on Nov. 5, 2009, now Pat. No. 8,276,264, which is a division of application No. 10/679,412, filed on Oct. 7, 2003, now abandoned.

(30) Foreign Application Priority Data

Oct. 7, 2002   (JP) ................................. 2002-293839

(51) Int. Cl.
*H05K 13/04*   (2006.01)
*H05K 13/00*   (2006.01)
*H05K 13/02*   (2006.01)

(52) U.S. Cl.
CPC .......... *H05K 13/0069* (2013.01); *H05K 13/021* (2013.01)
USPC .............................................. 29/739; 29/832

(58) Field of Classification Search
CPC .......... H05K 13/0061; H05K 13/0069; H05K 13/02–13/0495
See application file for complete search history.

(56) References Cited

U.S. PATENT DOCUMENTS 5,002,448 A    3/1991  Kamijima et al.
6,378,198 B1   4/2002  Asai et al.
(Continued)

FOREIGN PATENT DOCUMENTS

JP    06-177597    6/1994
JP    8-37398      2/1996
(Continued)

*Primary Examiner* — Livius R Cazan
(74) *Attorney, Agent, or Firm* — Oblon, Spivak, McClelland, Maier & Neustadt, L.L.P.

(57) ABSTRACT

A component mounting apparatus includes two board transfer devices each for transferring boards, at least one component supply device for supplying plural kinds of components to be mounted on the boards, and a component placing device including at least one component placing head for picking up the supplied components to mount the picked-up components on the boards and at least one head moving mechanism for moving the at least one component placing head in at least two directions parallel to a surface of the board. The apparatus also includes a controller that operates one component placing head to mount components alternately on two boards transferred by the two board transfer devices to respective component mounting positions and operates two component placing heads to mount components in parallel on two boards transferred by the two boards transfer devices to the respective component mounting positions.

6 Claims, 19 Drawing Sheets

(56) References Cited

U.S. PATENT DOCUMENTS

| | | |
|---|---|---|
| 6,643,917 B1 | 11/2003 | Gieskes |
| 6,729,017 B1 | 5/2004 | Kashiwagi et al. |
| 6,944,943 B2 | 9/2005 | Cho et al. |
| 6,988,612 B1 | 1/2006 | Kabeshita et al. |
| 7,082,680 B2 | 8/2006 | Kim et al. |
| 7,640,657 B2 | 1/2010 | Van Gastel |
| 8,276,264 B2 * | 10/2012 | Shimizu et al. ............ 29/739 |
| 2004/0033128 A1 * | 2/2004 | Kabeshita et al. ............ 414/935 |

FOREIGN PATENT DOCUMENTS

| | | |
|---|---|---|
| JP | 2000-323895 | 11/2000 |
| JP | 2001-313492 | 11/2001 |
| WO | WO 01/26440 | 4/2001 |
| WO | WO 02/17699 A1 | 2/2002 |
| WO | WO 0217699 A1 * | 2/2002 |

* cited by examiner

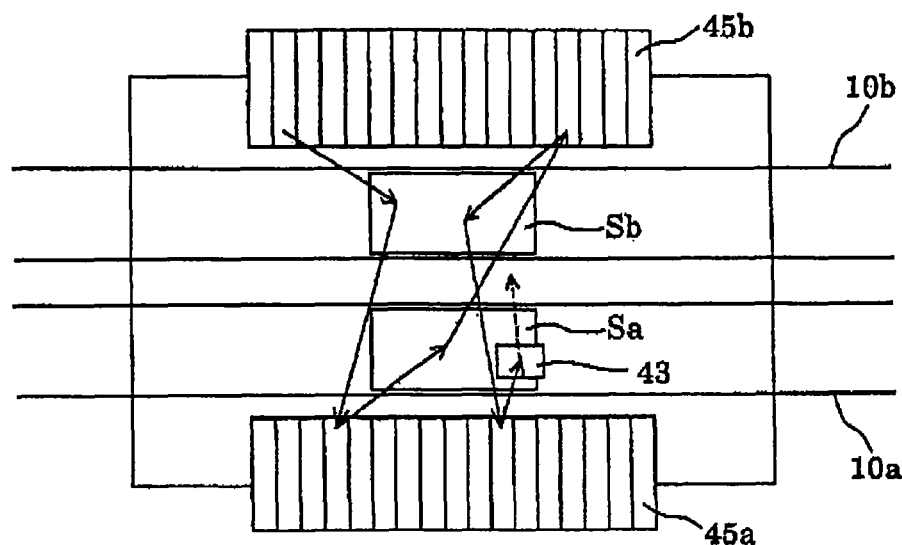
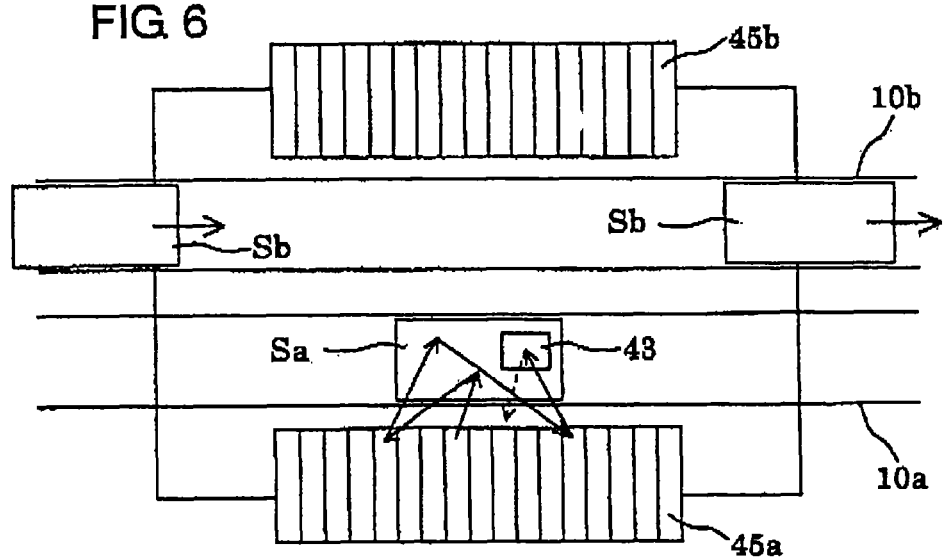

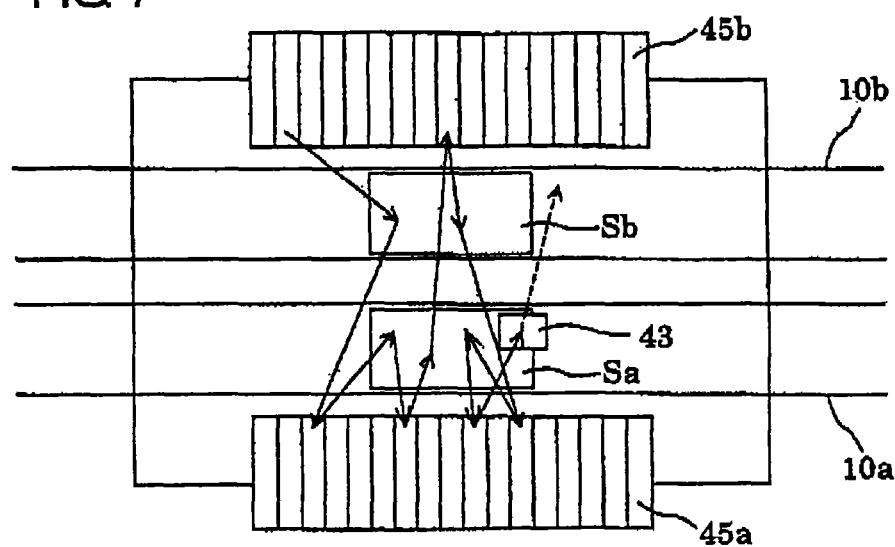
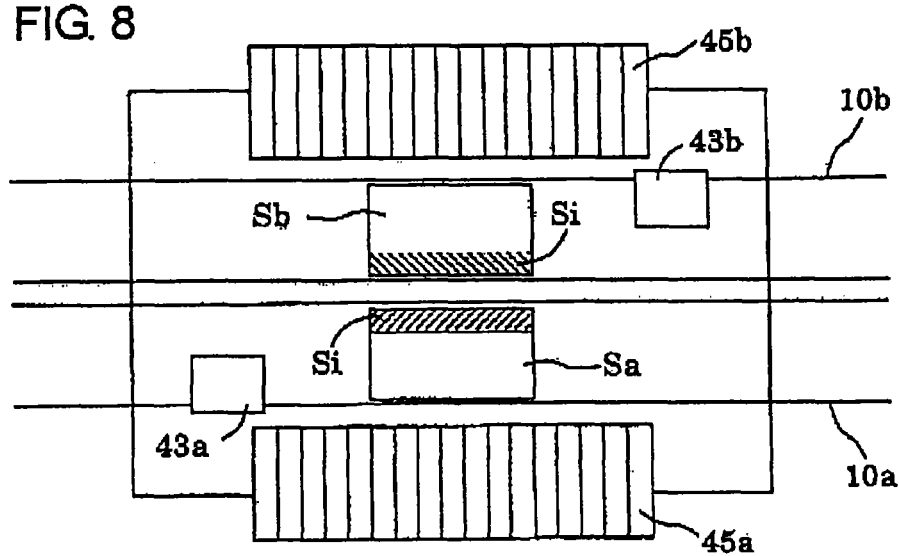

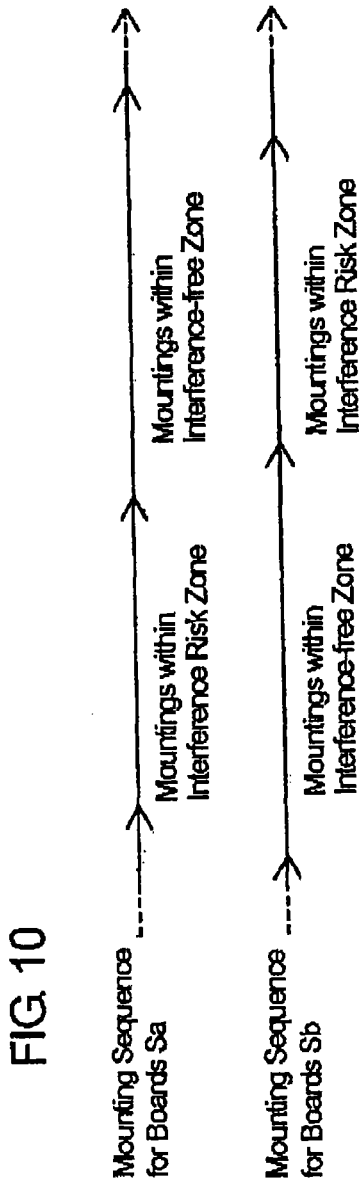

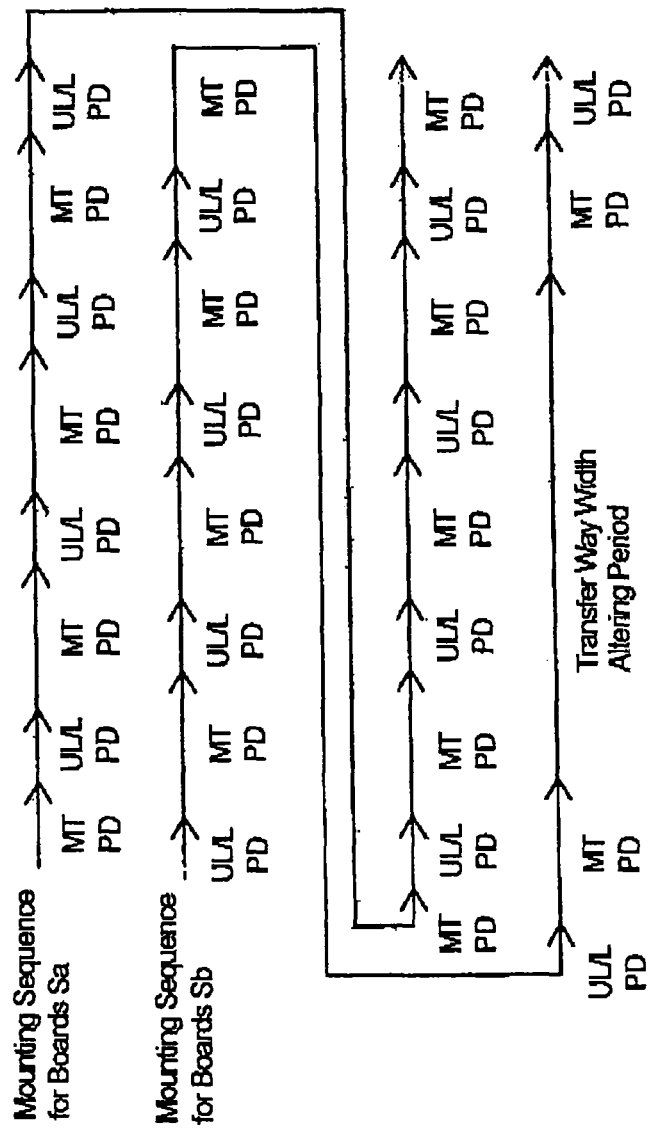

In Case of Both-side Mountings

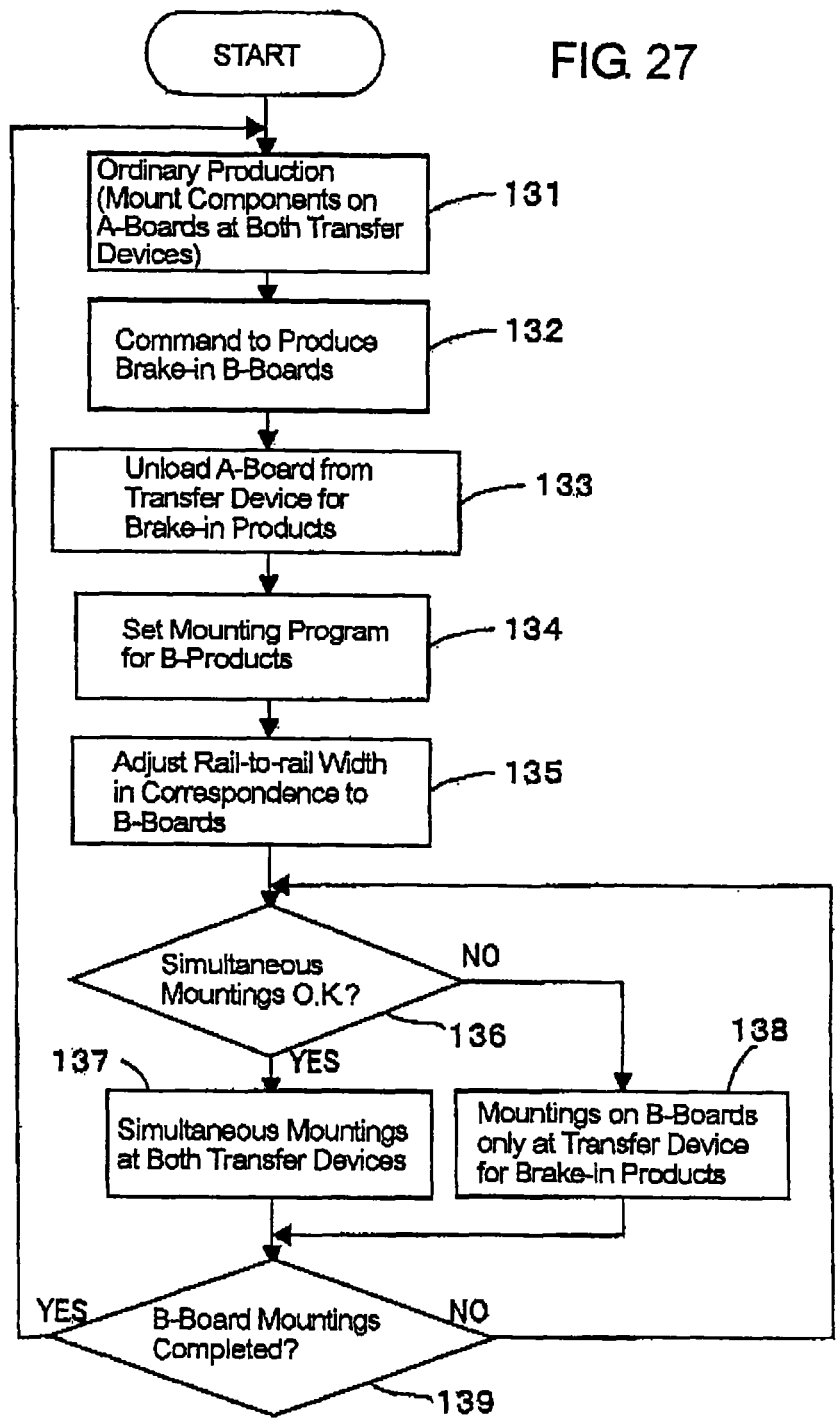

SYSTEM FOR MOUNTING COMPONENTS ON BOARDS

INCORPORATION BY REFERENCE

This application is a divisional of U.S. application Ser. No. 13/477,690 filed May 22, 2012, now abandoned, which is a divisional of Ser. No. 12/613,129 filed Nov. 5, 2009, now U.S. Pat. No. 8,276,264, which is a divisional of U.S. application Ser. No. 10/679,412 filed Oct. 7, 2003, now abandoned, which is based upon and claims priority under 35 U.S.C. §119 to Japanese Application No. 2002-293839 filed on Oct. 7, 2002, the entire contents of each of which are incorporated herein by reference.

BACKGROUND OF THE INVENTION

1. Field of the Invention

The present invention relates to a component mounting apparatus for mounting parts or components such as, preferably, ICs or other electronic parts on boards and also relates to a program for controlling the operation of the apparatus. It further relates to a component mounting system incorporating one or more such apparatus.

2. Discussion of the Related Art

Known electronic component mounting apparatus of this kind are of the construction that a single component placing device mounts components supplied from a component supply device, on one board loaded by a single board transfer device, and wherein the component mounting operation is performed on a board-by-board basis. In correspondence to this, a program used in such a component mounting apparatus and a system incorporating such a component mounting apparatus were designed to perform the component mounting operations on a board-by-board basis.

As mentioned above, in the known component mounting apparatus, the program used therefor and the known component mounting system which were designed to perform the component mounting operations on a board-by-board basis, the number of components which could be mounted during unit time period were almost constant. Further, the component mounting operations were discontinued during the transfer operation of the board by the board transfer device. For these reasons, it was difficult to enhance the board productivity.

Further, the production line in actual use were of the construction that plural mounting stations each provided with a component mounting apparatus of the aforementioned construction were connected in series. Therefore, it was often the case that when one mounting station fell in a trouble, the production line came into shutdown as a whole.

Moreover, when a board omitted to mount or missing a component which can be reworked was detected at a board inspection station arranged at the middle of the production line, the component mountings on the board were continued up to mounting the last component for the board, and outside the production line at another time, the component omitted to mount was mounted on the board through a manual reworking or the like. However, this way of reworking the defective board disadvantageously made the production control for the line complicated.

SUMMARY OF THE INVENTION

It is therefore a primary object of the present invention to provide an improved component mounting apparatus, an improved program therefor and an improved component mounting system which are capable of precluding and resolving the foregoing drawbacks involved in the prior art.

According to the present invention, there is provided a component mounting apparatus having two board transfer devices each for transferring boards, component supply means for supplying plural kinds of components to be mounted on the boards, and a component placing device. This placing device includes component placing head means for picking up the components supplied from the component supply means to mount the picked-up components on the boards and head moving means for moving the component placing head means at least two directions parallel to a surface of the board. The component placing device mounts the components simultaneously or alternately on two boards which have been transferred by the two board transfer devices to respective components mounting positions.

With this construction, components are mounted by the component placing device simultaneously or alternately on two boards transferred by the two board transfer devices, so that the component mountings on each board can be done efficiently. Further, where the timings when the two board transfer devices respectively transfer the boards are shifted from each other, it can be realized to perform the component mountings on one of the two boards during the transferring of the other board. This advantageously prevents the board transfer operation from causing the component mounting operations to be discontinued, so that the productivity of the boards can be enhanced even though the number of components which can be mounted during unit time remains unchanged.

In another aspect of the present invention, a component mounting apparatus is provided with two board transfer devices for respectively transferring boards in respective directions parallel to each other and each of the transfer devices is provided with two guide rails for guiding the boards. The apparatus is further provided with two component supply devices provided respectively at the outsides opposite to the center side where the two board transfer devices adjoin to each other and a component placing device composed of a component placing head for picking up the components supplied from the component supply devices to mount the picked-up components on the boards and a head moving mechanism for moving the component placing head in at least two directions parallel to a surface of the board. Of the two guide rails of each board transfer device, an outside guide rail adjacent to a corresponding one of the two component supply devices is fixedly provided, while the other guide rail at the center side is provided adjustably in a direction perpendicular to the direction in which the other guide rails extend.

With this configuration, of the two guide rails which are provided on each of the two board transfer devices for guiding the both sides of the boards, each outside guide rail adjacent to a corresponding one of the component supply devices is fixed, while each center side guide rail is adjustably positioned in a direction perpendicular to the lengthwise direction of the rails. Thus, when the space between each two guide rails is set narrow, an extra space is formed between two movable rails at the center side of both of the board transfer devices, and the two boards on the board transfer devices are further separated with the extra space, so that the chance for the two component placing heads to interfere with each other can be minimized.

In still another aspect of the present invention, a program is provided for controlling the operation of a component mounting apparatus. The apparatus includes two board transfer devices for respectively transferring boards; at least one component supply device for supplying components of plural kinds to be mounted on the boards; and a component placing device composed of at least one component placing head for picking up the components supplied from the component supply device to mount the picked-up components on the boards and head moving means corresponding in number to the at least one component placing head for moving the at least one component placing head in at least two directions parallel to a surface of the board. The program is designed to control the component mounting apparatus in such a way that the component placing device mounts components simultaneously or alternately on two boards transferred by the two component transfer devices to respective component mounting positions, and that while either one of the two board transfer devices is transferring the board on which component mountings have been completed, or while either one of the two board transfer devices is being adjusted to alter the transfer way width thereof, the at least one component placing head mounts the components intensively on the board at the other of the two board transfer devices. Thus, as long as one of the board transfer devices has not been prepared for the component mounting operations, the component placing head can be dedicated to performing the component mountings at the other of the two board transfer devices, so that the efficiency in mounting the components on the other board can be enhanced.

In a further aspect of the present invention, a component mounting system is provided using a component mounting apparatus which includes two board transfer devices for respectively transferring boards; a component supply device for supplying components of plural kinds to be mounted on the boards; and a component placing device for picking up the components supplied from the component supply device to mount the picked-up components on the boards. The system is operable selectively in first and second production modes. In the first production mode, the component placing device mounts components on two boards which have been transferred by the two board transfer devices to respective component mounting positions. In the second production mode, on the other hands, one of the two board transfer devices is used as mounting conveyor where the component placing device mounts components on the boards, while the other board transfer device is used as bypass conveyor by which the boards unnecessary to have components mounted thereon are transferred to bypass the mounting operations at the one board transfer device.

With this configuration, when a certain component mounting apparatus falls in difficulties in a production line having plural component mounting apparatus connected in series, the other transfer device can be utilized to make the boards bypass the troubled apparatus and to send the boards to another component mounting apparatus at the downstream for component mounting operations thereon. Therefore, it does not occur that the production line falls in shutdown as a whole. Further, the boards which are small in the number of the components to be mounted thereon can be made to bypass any component mounting apparatus which does not perform the component mounting operations for the boards, so that the productivity of the boards can be further enhanced.

BRIEF DESCRIPTION OF THE ACCOMPANYING DRAWINGS

The foregoing and other objects and many of the attendant advantages of the present invention may readily be appreciated as the same becomes better understood by reference to the following preferred embodiments of the present invention when considered in connection with the accompanying drawings, wherein like reference numerals designate the same or corresponding parts throughout the several views, and in which:

FIG. 5 is a rough plan view explaining the operation of the apparatus in the first embodiment;

FIG. 6 is another rough plan view explaining the operation of the apparatus in the first embodiment;

FIG. 7 is still another rough plan view explaining the operation of the apparatus in the first embodiment;

FIG. 8 is a rough plan view showing an interference risk zone within which first and second component placing heads have a risk to interfere with each other;

FIG. 10 is a time chart explaining the operation of the apparatus in the third embodiment;

FIG. 11 is a time chart explaining the operation of the apparatus in the fourth embodiment;

FIG. 27 is a flow chart explaining the operation of the apparatus in the sixth embodiment.

DETAILED DESCRIPTION OF THE PREFERRED EMBODIMENTS

A component mounting apparatus, a program for controlling the operation thereof and a component mounting system all according to the present invention will be described hereinafter by reference to the embodiments shown in the accompanying drawings. First of all, the component mounting apparatus according to the present invention will be described with reference to FIGS. 1 to 3. This component mounting apparatus is composed of first and second board transfer devices 10a, 10b, conveyor width adjusting devices 30 respectively associated with the board transfer devices 10a, 10b for use therefor, a component placing device 40 and first and second component supply devices 45a, 45b.

Figure 2:
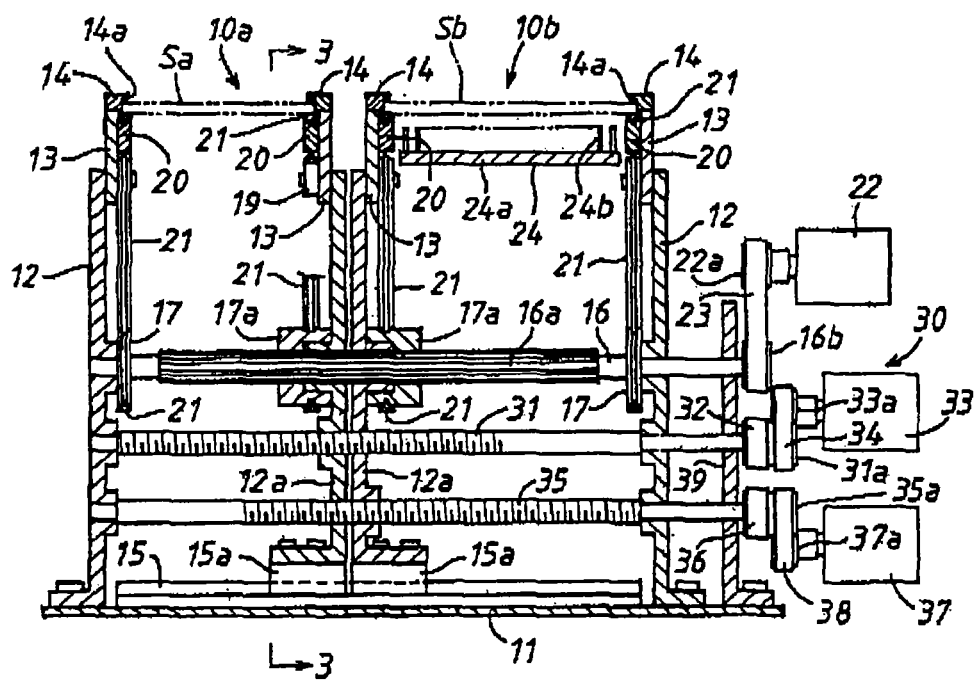
FIG. 2 is an enlarged cross-section of first and second board transfer devices taken along the line 2-2 in FIG. 1.
Figure 3:
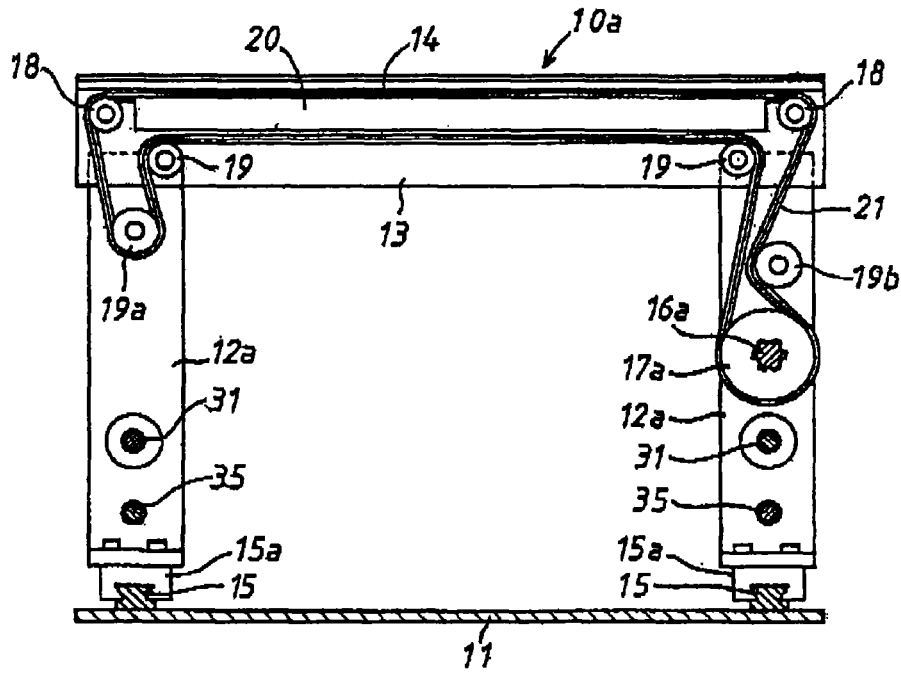
FIG. 3 is a longitudinal section taken along of the line 3-3 in FIG. 2.

The first and second board transfer devices 10a, 10b take substantially the same construction with each other, and therefore, the first board transfer devices 10a will be mainly described for the both transfer devices 10a, 10b. In the first board transfer devices 10a, as shown in FIGS. 2 and 3, a pair of outside support pedestals 12, 12 are upright fixed on a base 11, and a pair of inside support pedestals 12a, 12a which face the outside support pedestals 12, 12 are upright fixed respectively on sliders 15a, 15a. In order to make the distance between the outside support pedestals 12, 12 and the inside support pedestals 12a, 12a variable, the sliders 15a, 15a are slidably carried on the base 11 along guide rails 15, 15 which extend in perpendicular to the outside support pedestals 12, 12. A pair of support plates 13, 13 are secured respectively to upper inner surfaces of the outside support pedestals 12, 12 and upper inner surfaces of the inside support pedestals 12a, 12a. A pair of side rails 14, 14 are fixed on the top surfaces of the support plates 13, 13. Upper edges of the side rails 14, 14 at the outside and inside are formed respectively with flange portions 14a, 14a which protrude inwardly toward each other. These flange portions 14a, 14a are respectively over support rails 20, 20 which are secured respectively to the inner surfaces of the support plates 13, 13.

The second board transfer device 10b is provided on the base 11 in parallel relation and symmetrically with the first board transfer device 10a, with a pair of inside support pedestals 12a, 12a adjoining to those of the first board transfer device 10a. Further, on the base 11, a support plate 39 is upright fixed at the outside of the outside support pedestals 12 of the second board transfer device 10b.

The opposite end portions of a transfer rotary shaft 16 which is arranged to extend perpendicularly of the support plates 13 are rotatably carried respectively in the outside support pedestals 12, 12 of the board transfer devices 10a, 10b. A spline shaft portion 16a which forms the middle portion of the transfer rotary shaft 16 passes through the inside support pedestals 12a, 12a rotatably and axially movably. Outside drive pulleys 17, 17 are secured respectively onto the opposite end portions adjoining to the outside support pedestals 12, 12, of the transfer rotary shaft 16. The inside support pedestals 12a, 12a are formed with boss portions through which the spline shaft portion 16a passes, and inside drive pulleys 17a, 17a are carried respectively on the boss portions to be rotatable and not to be axially movable. The inside drive pulleys 17a, 17a are spline-engaged with the spline shaft portion 16a to be slidable thereon, so the rotation of the transfer rotary shaft 16 can be transmitted to the inside drive pulleys 17a, 17a.

As shown mainly in FIG. 3, the support plate 13 secured to the inside support pedestals 12a, 12a rotatably carry pairs of pulleys 18, 18, 19, 19 at opposite ends slightly below the side rail 14 and at lower inside portions, and pulleys 19a, 19b are rotatably supported under between the pulleys 18 and 19. An endless conveyor belt 21 with a T-shape cross-section is wound between the inside drive pulley 17a and these pulleys 18, 18, 19, 19, 19a, 19b. Each of the pulleys 17a, 18, 18 and 19a is formed with a circumferential groove which is engageable complementally with the T-shape cross-section of the conveyor belt 21 so as to prevent the same from being dislocated therefrom. A part of each conveyor belt 21 expanded between the pair of pulleys 18, 18 resides maintaining a constant distance or spacing from the flange portion 14a of the corresponding side rail 14. A longitudinal groove whose cross-section is complementarily fit with the T-shape cross-section of the conveyor belt 21 is formed at the upper surface of the support rail 20 secured to the support plate 13 between the pulleys 18, 18 for supporting and guiding that part of the conveyor belt 21. Likewise, the support plate 13 secured to the outside support pedestals 12, 12 is provided with pulleys 18, 18, 19, 19,19a, 19b respectively corresponding to those provided on the inside support pedestals 12a. An endless conveyor belt 21 is wound between the outside drive pulley 17 and these pulleys 18, 18, 19, 19, 19a, 19b, and a support rail 20 for supporting and guiding the conveyor belt 21 is provided on the support plate 13 secured to the outside support pedestals 12, 12.

Boards Sa, Sb are loaded into and unloaded from the component mounting apparatus with both side edges thereof being supported by the respective pairs of the conveyor belts 21, 21, 21, 21 of the first and second board transfer devices 10a, 10b. After being transferred to respective predetermined positions, the boards Sa, Sb are lifted up with the elevation of backup devices 24 and are positioned to respective component mounting positions as a result of being brought into abutting engagement with the flange portion 14a of each side rail 14.

In this particular embodiment, the transfer rotary shaft 16 is used in common to both of first and second board transfer devices 10a, 10b and is rotated to drive the conveyor belts 21 of the both transfer devices 10a, 10b. However, a drive device for the conveyor belts 21 is not constrained to this type. Two transfer rotary shafts 16 may be provided for the first and second board transfer devices 10a, 10b and may be rotated by individual conveyor drive motors 22. In the case of being so modified, it becomes realized to drive the conveyor belts 21, 21 of the transfer devices 10a, 10b independently of each other. In this modified case, the two transfer rotary shafts 16, 16 can be provided being carried respectively on the support pedestals 12a, 12a which are spaced in the transfer direction.

Next, the conveyor width adjusting devices 30 will be described hereafter with reference to FIGS. 2 and 3. A pair of first screw shafts 31, 31 arranged in parallel to the transfer rotary shaft 16 are provided for altering the distance between the both of the support pedestals 12, 12a of the first board transfer device 10a and hence, the distance between the support plates 13, 13 secured to the support pedestals 12, 12a. Each of the first screw shafts 31 is rotatably carried at its opposite ends in the outside support pedestals 12, 12 of the first and second transfer devices 10a, 10b and rotatably and axially movably passes at its middle portion through the inside support pedestal 12a of the second board transfer device 10b. A threaded portion of each screw shafts 31 which is formed mainly at the side of the first board transfer device 10a is thread-engaged with the boss portion which is formed on the inside support pedestal 12a of the first board transfer device 10a. Passing through the corresponding outside support pedestal 12 of the second board transfer device 10b, one end of each first screw shaft 31 is protruded from the support plate 39 and has a pulley 31a secured thereto. The pulleys 31a, 31a of the both first screw shafts 31, 31 are in driving connection with each other with a connection belt 32 being wound between the half portions in the width direction thereof. A first drive motor 33 is supported (the supporting structure not shown) on the base 11, and a drive belt 34 is wound between a pulley 33a secured to an output shaft of the first drive motor 33 and the remaining half portion in the width direction of one of the pulleys 31a, 31a. Thus, the both first screw shafts 31, 31 are synchronously rotated by the first drive motor 33 thereby to alter the width of the first board transfer device 10a in the direction perpendicular to the transfer direction (i.e., the distance between the support plates 13 and 13 secured to the both support pedestals 12, 12a and hence, the distance between the side rails 14 and 14).

Another pair of second screw shafts 35, 35 arranged in parallel to the transfer rotary shaft 16 are provided for altering the distance between the both of the support pedestals 12, 12a of the second board transfer device 10b and hence, the distance between the support plates 13, 13 secured to the support pedestals 12, 12a. Each of the second screw shafts 35 is rotatably carried at its opposite ends in the outside support pedestals 12, 12 of the first and second transfer devices 10a, 10b and rotatably and axially movably passes at its middle portion through the inside support pedestals 12a of the first board transfer device 10a. A threaded portion of each screw shafts 35 which is formed mainly at the side of the second board transfer device 10b is thread-engaged with the boss portion which is formed on the inside support pedestal 12a of the second board transfer device 10b. Other parts associated with the second screw shafts 35, 35 are substantially the same in construction as those parts associated with the first screw shafts 31, 31. Thus, the other parts are omitted from being described in detail wherein however, the members associated with the second screw shafts 35, 35 are denoted using reference numerals which are respectively larger by "4" than those put on the corresponding members associated with the first screw shafts 31, 31. Thus, with the rotation of the second drive motor 37, the both second screw shafts 35, 35 are rotated synchronously with each other, whereby the width of the second board transfer device 10b in a direction perpendicular to the transfer direction can be altered independently of that of the first board transfer device 10a.

In this particular embodiment, the pairs of inside support pedestals 12a, 12a of the first and second transfer devices 10a, 10b are movable independently of each other pair with the pairs of outside support pedestals 12, 12 being fixed on the base 11. However, the structure of the transfer devices 10a, 10b is not restricted to this type. In one modified form, the pairs of inside support pedestals 12a, 12a may be fixed on the base 11, and instead, the pairs of the outside support pedestals 12, 12 may be movable with the two screw shafts 31, 35 independently of each other pair. Or, in another modified form, the outside support pedestals 12 of one of the board transfer devices 10a (10b) and the inside support pedestals 12a of the other board transfer device 10b (10a) may be fixed on the base 11, and the remaining outside support pedestals and the remaining inside support pedestals may be independently movable with the two screw shafts 31, 35. In still another modified form, only the outside support pedestal 12 of one of the board transfer devices 10a (10b) may be fixed on the base 11, the two pairs of inside support pedestals 12a, 12a may be bodily movable with a screw shaft, and the outside support pedestal 12 of the other board transfer device 10b (10a) may be movable with another screw shaft independently of the two pairs of inside support pedestal 12a, 12a.

Figure 1:
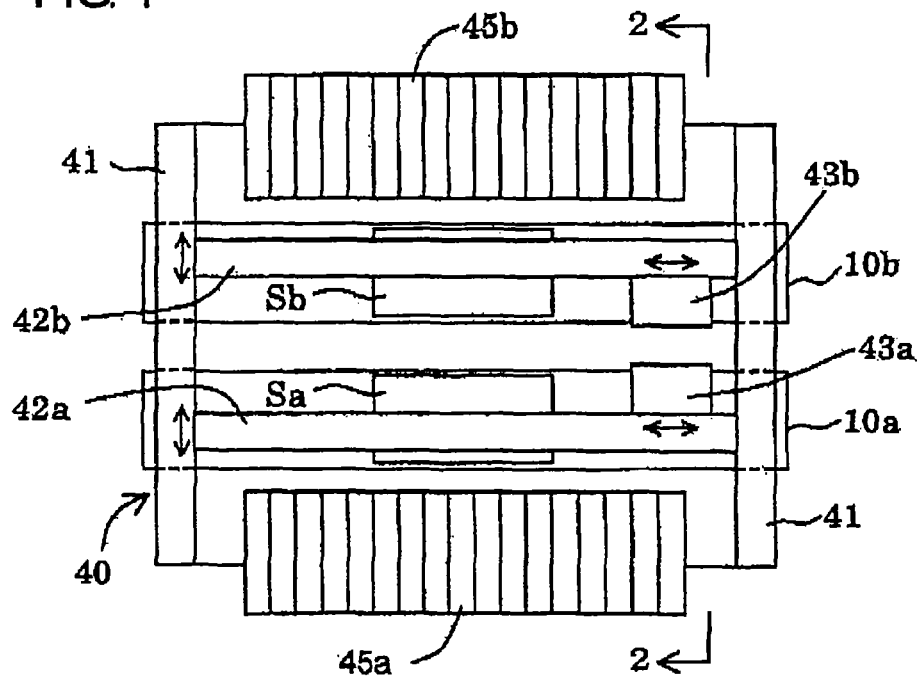
FIG. 1 is a plan view showing the general construction of an electronic component mounting apparatus according to the present invention.

As shown in FIG. 1, the component placing device 40 is composed of a pair of fixed rails 41, 41 which are supported on the base 11, to be arranged over the opposite ends of the both board transfer devices 10a, 10b in parallel relation with each other, two head guide rails 42a, 42b which are arranged perpendicularly to the fixed rails 41, 41 with both ends thereof being supported movably along the fixed rails 41, 41 and two component placing heads 43a, 43b supported movably respectively along the head guide rails 42a, 42b. The fixed rails 41, 41 and the head guide rails 42a, 42b constitute head moving mechanisms each for feeding an associated one of the component placing heads 43a, 43b at least in two directions parallel to a component mounting surface (i.e., upper surface in this particular embodiment) of each board Sa, Sb. Each of the component placing heads 43a, 43b is provided with a vertically movable suction nozzle unit (not shown) for sucking or holding a component thereto. The head guide rails 42a, 42b, the two component placing heads 43a, 43b and the suction nozzle units are controlled respectively by servomotors (not shown), so that each suction nozzle unit successively holds plural components supplied from component supply devices 45a, 45b and successively mounts the components on the boards Sa, Sb held at the component mounting positions on the board transfer devices 10a, 10b, as described later in more detail.

As shown in FIG. 1, each of the component supply devices 45a, 45b comprises a plurality of feeders juxtaposed on a feeder table fixed on the base 11. Each feeder is of a tape-feed type, for example. This tape-feed type feeder contains a slender tape, which has enclosed components of a certain kind at a regular pitch or interval in such a way that the tape is wound about a supply reel and is able to feed the components one by one to its extreme end close to the board transfer device 10a or 10b at the same side. Thus, each component fed to the extreme end of each feeder can be taken or picked up by either of the component placing head 43a, 43b. The tape comprises a base tape retaining the components thereon and a cover tape covering the same. At the extreme end of each feeder, the cover tape is peeled off the base tape thereby to enable each component to be sucked or held by the suction nozzle unit, and the base tape is turned down to be wound on a collector reel. Although in this particular embodiment, the component supply devices 45a, 45b are provided respectively at both outsides of the first and second board transfer devices 10a, 10b, namely one at each outside thereof, only one component supply device 45a or 45b may be provided outside one of the board transfer devices 10a, 10b.

Figure 4:
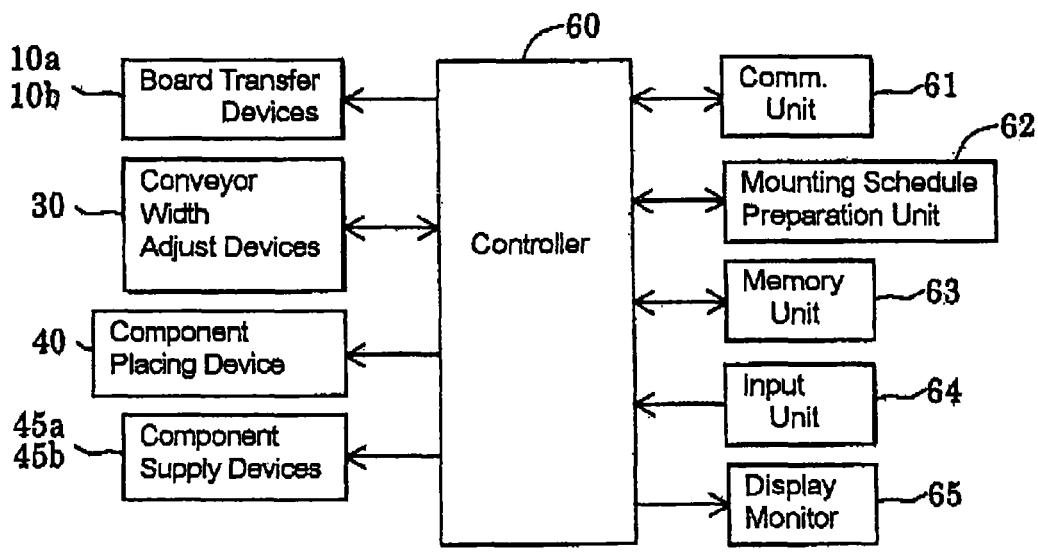
FIG. 4 is a block diagram showing a control system of the electronic component mounting apparatus shown in FIG. 1.

The operation of the component mounting apparatus as described above is controlled by a controller 60 shown in FIG. 4. The controller 60 is connected to the first and second board transfer devices 10a, 10b, the conveyor width adjusting devices 30, the component placing device 40 and the component supply devices 45a, 45b. The controller 60 is further connected to a communication unit 61, an input unit 64, a display monitor 65, a memory unit 63 and a mounting schedule preparation unit 62. The communication unit 61 is operable to communicate with a host computer (not shown) which supervises a production line including the component mounting apparatus. Via the communication unit 61, mounting data for each kind of products (i.e., the kinds of components to be mounted and mounting coordinates data therefor) and production schedule data (i.e., data indicative of the production sequence and the number of production on a board type basis) and the like are transmitted to the component mounting apparatus from the host computer.

The mounting schedule preparation unit 62 prepares a mounting program which is actually executed by the component mounting apparatus, based on the mounting data for respective kinds of the products and the production schedule data which have been transmitted from the host computer. More specifically, the preparation unit 62 determines a mounting sequence taking into account the most suitable arrangement of the feeders within the component supply devices 45a, 45b which depends on the respective numbers on a kind-by-kind basis of the boards scheduled to be produced, and the respective mounting speed rates in case that boards of two kinds are produced simultaneously or in parallel time relation, and prepares a mounting program capable of obviating such a situation that the productivity is lowered due to the two board transfer devices 10a, 10b both transferring the boards Sa, Sb at the same time. In a modified form of the embodiment, the mounting program preparation processing performed by the mounting schedule preparation unit 62 may be executed by the host computer, and the prepared mounting program may be transmitted to the component mounting apparatus.

The memory unit 63 stores various programs, data, log and the like therein. In this particular embodiment, the memory unit 63 stores therein the mounting data and production schedule data which are transmitted from the host computer on a kind-by-kind basis and mounting programs which are prepared based on such data and information. The input unit 64 includes a keyboard and push buttons for inputting necessary data and commands. The display monitor 65 comprises a display device such as LCD or CRT for displaying necessary information.

The operation of the component mounting apparatus as constructed above will be described hereafter.

(First Embodiment)

First of all, the operation of the first embodiment provided with the two board transfer devices 10a, 10b, the two component supply devices 45a, 45b and the component placing device 40 which is now assumed to have a single component placing head 43 contrary to the two illustrated placing heads 43a, 43b will be described with reference to FIGS. 5 to 7. As mentioned earlier, the component mounting apparatus in the first embodiment is operated in accordance with a mounting program which is designed to obviate the situation that the two board transfer devices 10a, 10b are both in operation to transfer the boards Sa, Sb at the same time.

The operation of the first embodiment will be described with reference to a flow chart shown in FIG. 24. When neither of the board transfer devices 10a, 10b is transferring the board Sa or Sb thereon, nor is adjusting the transfer way width thereof, the controller 60 advances the control operation from Step 100 to Step 104 by way of Steps 101 to 103. At Step 104, the component placing head 43 of the component placing device 40 successively picks up designated components from the component supply devices 45a, 45b and successively mounts them at programmed coordinate positions on the boards Sa, Sb which are being held at the respective component mounting positions on the board transfer devices 10a, 10b.

In the component mounting operations performed by the component placing head 43 of the component placing device 40, the components may be mounted one by one alternately on the board Sa and the board Sb. As shown in FIG. 5 for example, this may be done in such a way that a component picked up from the second component supply device 45b is mounted on the board Sb held on the second board transfer device 10b, that then, another component picked up from the first component supply device 45a is mounted on the board Sa held on the first board transfer device 10a, that again, another component picked up from the second component supply device 45b is mounted on the board Sb, and that next, another component picked up from the first component supply device 45a is mounted on the board Sa. Or, in the component mounting operations performed by the component placing head 43, the frequency of mounting components on the board Sa may be made different from that of mounting components on the board Sb. As shown in FIG. 7 for example, this may be done in such a way that the step of mounting on the board Sb a component picked up from the second component supply device 45b is performed once, that next, the step of mounting on the board Sa another component picked up from the first component supply device 45a is repeated twice, that again, the step of mounting on the board Sb another component picked up from the second component supply device 45b is performed once, and that then, the step of mounting on the board Sa another component picked up from the first component supply device 45a is repeated twice. Although the rate in the component mounting frequency is such that the mounting on the board Sb and the mounting on the board Sa are 1:2, it can be varied as desired by changing the number of repetition times through which the steps of mounting components on the same board in succession are performed.

In the foregoing two examples, each component is picked up from the component supply device 45a or 45b closer to the board Sa or Sb on which it is to be mounted. As the case may be, each component may be picked up from the component supply device far away from the board on which it is to be mounted. Or, in a modified form, the component mounting apparatus may be provided with one component supply device only, from which components are picked up one after another to be mounted on the both of the boards Sa, Sb.

Figure 24:
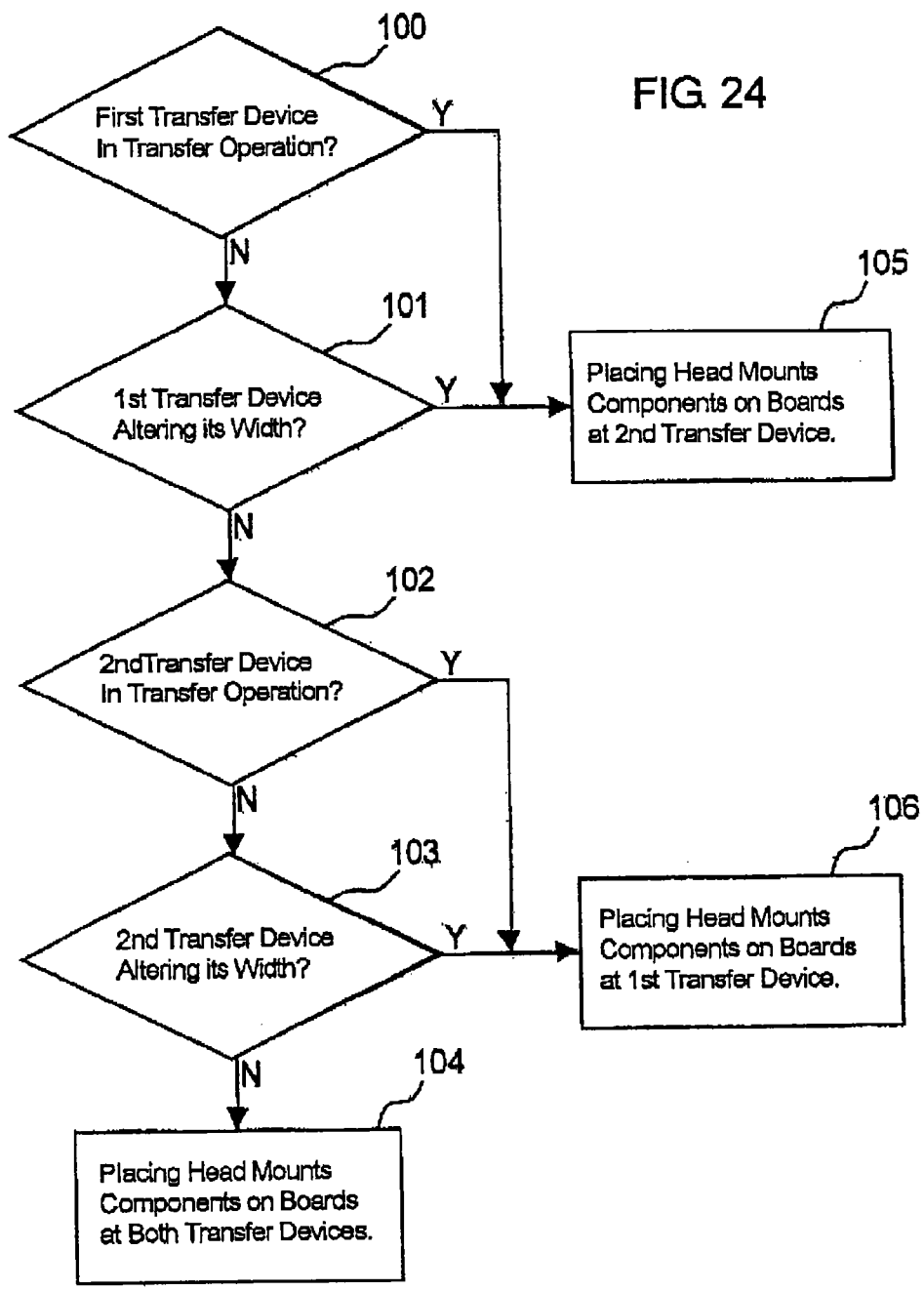
FIG. 24 is a flow chart explaining the operation of the apparatus in the first embodiment.

Returning to the operation according to the flow chart shown in FIG. 24, when as shown in FIG. 6, the second board transfer device 10b is transferring the boards Sb or is varying the width of its transfer way, the controller 60 advances the control operation step from Step 100 to Step 102 or 103 via Step 101 and further to Step 106. Since it cannot be done to mount components on the board Sb while the second board transfer device 10b is transferring the board Sb or is varying the transfer way width thereof, the component placing head 43 of the component placing device 40 successively picks up designated components from the first component supply device 45a and mounts them one after another only on the board Sa held at the component mounting position on the first transfer device 10a, as shown in FIG. 6. In this manner, the component placing head 43 does not mount components on the board Sb, and instead, does mount components intensively on the board Sa held on the first board transfer device 10a. As a consequence, the time taken to mount the components on the board Sa during that time can be shortened, so that the mounting efficiency can be enhanced.

Similarly, when the first board transfer device 10a is transferring the board Sa or is varying the width of its transfer way, the controller 60 advances the control operation step from Step 100 or 101 to Step 105. Also in this case, the component placing head 43 successively picks up designated components from the second component supply device 45b and mounts them one after another only on the board Sb held at the component mounting position on the second transfer device 10b. In this manner, the component placing head 43 does not mount components on the board Sa, and instead, does mount components intensively on the board Sb held on the second board transfer device 10b. As a result, the time taken to mount the components on the board Sb during that time can be shortened, so that the mounting efficiency can be enhanced.

Although the foregoing first embodiment has been described taking as example the component mounting apparatus of the type that the component placing device 40 is provided with a single component placing head, the first embodiment may be applicable to the component mounting apparatus of the type that the component placing device 40 is provided with two component placing heads 43i, 43b. In this case, when neither of the two board transfer devices 10a, 10b is performing the board transfer operation, nor is varying the width of its transfer way, the two component placing heads 43a, 43b respectively mount components in parallel time relation on the boards Sa, Sb held on the board transfer devices 10a, 10b associated therewith.

On the other hand, when either one of the two board transfer devices 10a (or 10b) is performing the board transfer operation, or is varying the width of its transfer way, the component placing head 43a (or 43b) associated with such transfer device 10a (or 10b) assists or helps the other component placing heads 43b (or 43a) associated with the other board transfer device 10b (or 10a) in mounting components on the board Sb (or Sa) held on the other board transfer device 10b (or 10a). Also in this case, the time taken to mount the components on the board Sb during that time can be further shortened, so that the mounting efficiency can be further enhanced. In this case, however, consideration has to be taken to obviate the physical interference between the two component placing heads 43b, 43a with each other, as described hereinafter.

As shown in FIGS. 1 and 8, in the case of the component mounting apparatus including the two board transfer devices 10a, 10b, the two component supply devices 45a, 45b and the component placing device 40 with the two component placing heads 43a, 43b, it is preferable from the viewpoint of reducing the feed distance of each component to be mounted as well as simplifying the control program, to make the first placing head 43a mount components mainly on the board Sa and to make the second placing head 43b mount components mainly on the board Sb. Also in this case, when the both component placing heads 43a, 43a stay within respective predetermined interference risk zones Si, Si adjacent to the central portion between the boards Sa and Sb, it becomes difficult to obviate the physical interference between the placing heads 43a and 43b. The term "central portion" used in this context means the center of the point symmetry which is made by the boards Sa, Sb stopped at the respective component mounting positions for the component mountings, or where parts or all of edge portions of the both boards Sa, Sb are juxtaposed with each other, the term means the center line of the zone where the edge portions are juxtaposed. The term "predetermined interference risk zones Si, Si" means the areas or zones defined on the boards Sa, Sb which the plane shapes of the component placing heads 43a, 43b cover outside or around the aforementioned center portion, and encompassing the same therein. Further, other parts on each of the boards Sa, Sb except for the interference risk zone Si is an interference-free zone. The embodiments devised to obviate the aforementioned physical interference will be described hereafter.

(Second Embodiment)

Figure 9:
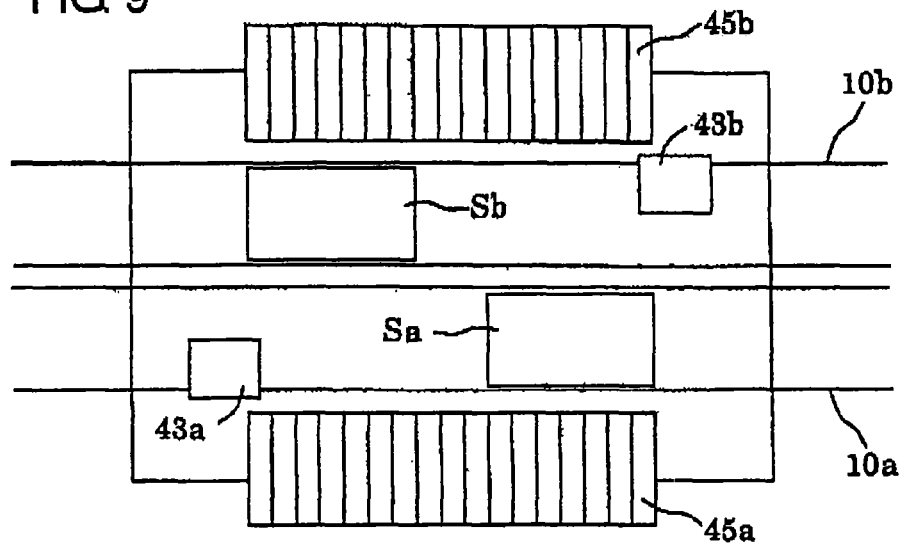
FIG. 9 is a rough plan view explaining the operation of the apparatus in the second embodiment.

In the second embodiment shown in FIG. 9, the two board transfer devices 10a, 10b are controlled to make different from each other the stop positions in the transfer direction to which the boards Sa, Sb are respectively stopped for component mounting operations thereon. The predetermined interference risk zones Si, Si adjacent to the central portion between the boards Sa, Sb during the component mounting operations no longer exist where the respective stop positions are separated a suitable distance or more. This advantageously can preclude the chance that the two component placing heads 43a, 43b interfere with each other in mounting components respectively on the boards Sa, Sb. Therefore, the efficiency in mounting components on the boards Sa, Sb can be enhanced, and at the same time, the program for controlling the operation of the component mounting apparatus can be simplified.

(Third Embodiment)

Figure 25:
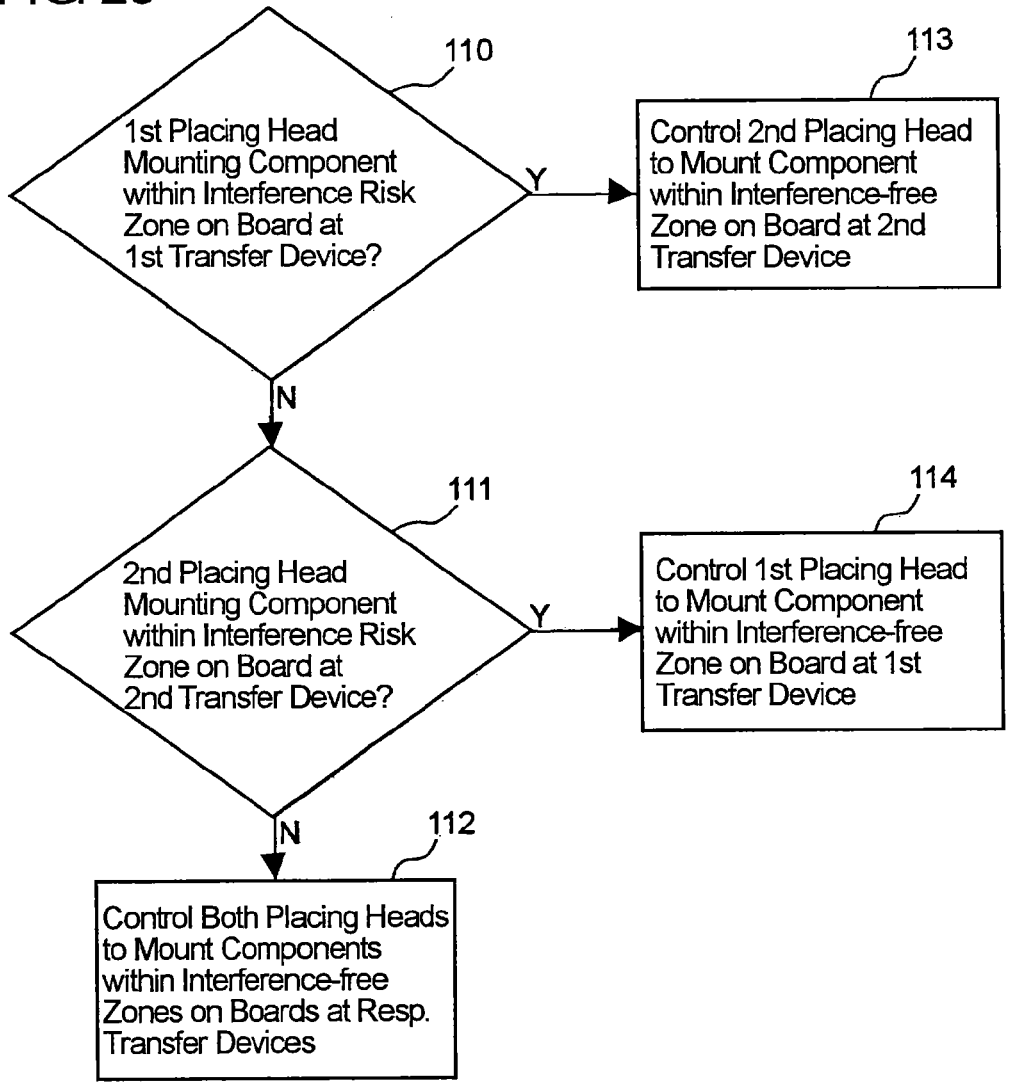
FIG. 25 is a flow chart explaining the operation of the apparatus in the third embodiment.

In the aforementioned second embodiment, the interference of the two component placing heads 43a, 43b is obviated by devising the physical arrangement of the stop positions of the boards Sa, Sb. For the same purpose or effect, the third embodiment is practiced as shown in FIGS. 10 and 25 respectively as a time chart and a flow chart, wherein by devising the control program for the component mounting apparatus, the interference can be obviated without shifting the stop positions of the boards Sa, Sb from each other. Likewise as aforementioned, on the assumption that the first component placing head 43a mounts components mainly on the board Sa while the second component placing head 43b mounts components mainly on the board Sb, this third embodiment will be described hereinafter.

At the beginning, when neither of the first and second component placing heads 43a, 43b is mounting any component within the interference risk zone Si on the board Sa (or Sb) corresponding thereto, the controller 60 advances its control operation from Step 110 to Step 112 via Step 111 of the flow chart shown in FIG. 25. At Step 112, each of the component placing heads 43a, 43b mounts a component within the interference-free zone on the board Sa, Sb held on the board transfer device 10a, 10b corresponding thereto. On the contrary, when the first component placing head 43a performs the component mounting within the interference risk zone Si on the board Sa held on the board transfer device 10a corresponding thereto, the control operation of the controller 60 is advanced from Step 110 to Step 113, whereby the second component placing head 43b mounts a component within the interference-free zone on the board Sb held on the second board transfer device 10b. Further, when the second component placing head 43b performs the component mounting within the interference risk zone Si on the board Sb held on the second board transfer device 10b, the control operation of the controller 60 is advanced from Step 111 to Step 114, whereby the first component placing head 43a mounts a component within the interference-free zone on the board Sa held on the first board transfer device 10a. Therefore, it does not occur that the component placing heads 43a, 43b simultaneously mount components within the interference risk zones Si, Si of the boards Sa, Sb, and there can be avoided such a danger or chance that the two component placing heads 43a, 43b interfere with each other in performing the component mountings on the boards Sa, Sb.

(Fourth Embodiment)

Figure 12:
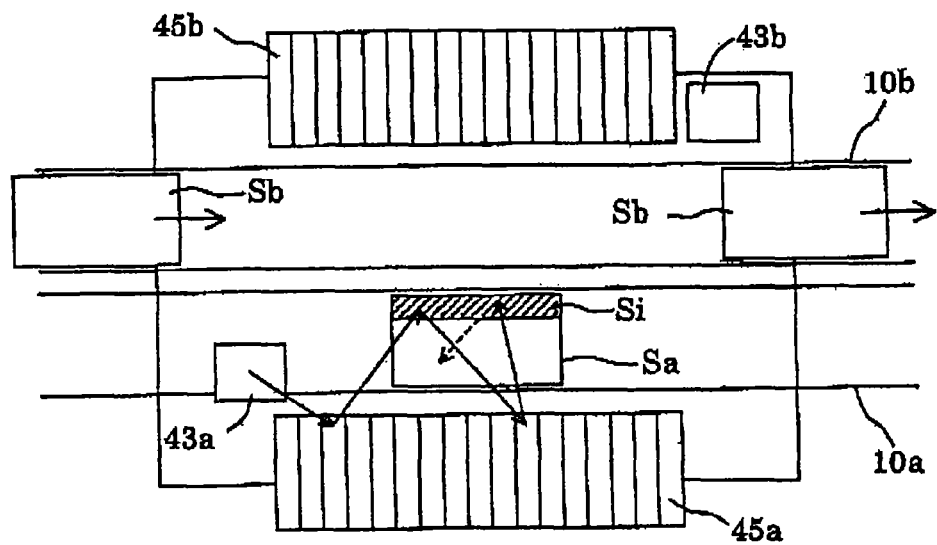
FIG. 12 is a rough plan view explaining the operation of the apparatus in the fourth embodiment.
Figure 26:
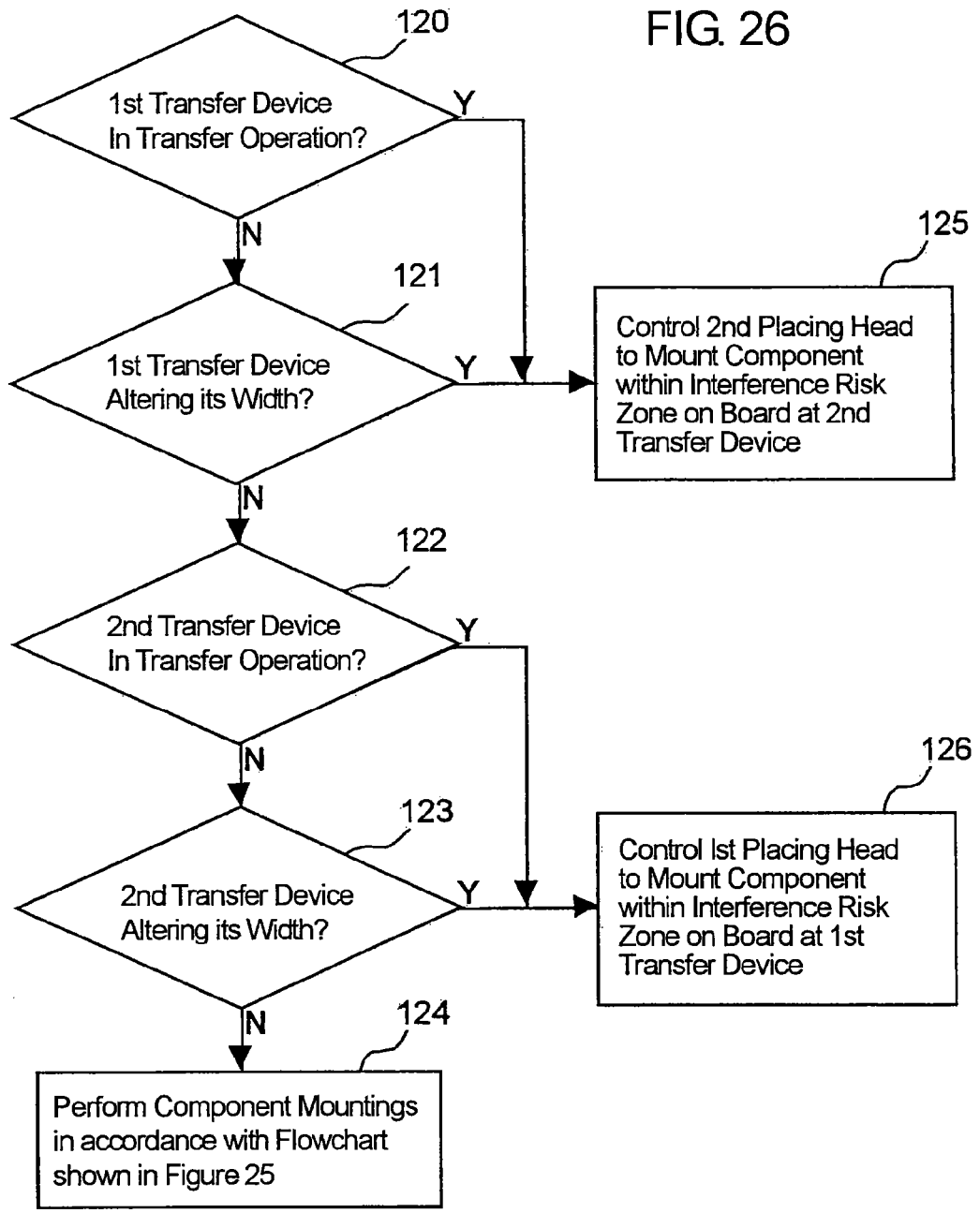
FIG. 26 is a flow chart explaining the operation of the apparatus in the fourth embodiment.

Also in the fourth embodiment shown in FIGS. 11, 12 and 26, the interference between the two component placing heads 43a, 43b is obviated by devising the control program for the component mounting apparatus, without shifting the mounting positions of the both boards Sa, Sb. Next, the operation of the fourth embodiment will be described in accordance mainly with the flow chart shown in FIG. 26.

At the beginning, when neither of the two board transfer devices 10a, 10b is performing the board transfer operation, nor is altering the width of its transfer way, the controller 60 advances the control operation from Step 120 to Step 124 via Steps 121-123. At this Step 124, the component placing heads 43a, 43b of the component placing device 40 pick up components respectively from the first and second component supply devices 45a, 45b and mount them at designated coordinate positions within the interference-free zone on the boards Sa, Sb held on the board transfer devices 10a, 10b.

On the other hand, when the second board transfer device 10b is transferring the boards Sb as shown in FIG. 12, or is altering the width of its transfer way, the controller 60 advances the control operation step from Step 120 to Step 122 or 123 via Step 121 and further to Step 126. At this Step 126, the first component placing head 43a successively picks up designated components from the first component supply device 45a and mounts them one after another at the designated positions within the interference risk zone Si on the board Sa held at the component mounting position on the first board transfer device 10a. Since no component mounting is performed on the board Sb while the second board transfer device 10b is transferring the boards Sb or is altering the width of its transfer way, the second component placing head 43b may be made to flee to the position where it has no chance to interfere with the first component placing head 43a, as shown in FIG. 12. When so fleeing, the second component placing head 43b hardly interferes with the first component placing head 43a which is operating to mount components within the interference risk zone Si on the board Sa. Or, the second component placing head 43b may be directed to help the first component placing head 43a in mounting components within the interference risk zone Si on the board Sa. Where the second component placing head 43b is so directed, the productivity of the boards Sa can be enhanced. In this latter case, the two component placing heads 43a and 43b have to be controlled to obviate the interference therebetween.

Similarly, when the first board transfer device 10a is transferring the boards Sa or is altering the width of its transfer way, the controller 60 advances the control operation step from Step 120 or 121 to Step 125, and the second component placing head 43b successively mounts components at designated positions within the interference risk zone Si on the board Sb held on the second board transfer device 10b. Also in this case, the first component placing head 43a which does not perform mounting the components on the board Sa is made to take shelter or flee, so that it does not occur that the first component placing head 43a interferes with the second component placing head 43b which is mounting the components within the interference risk zone Si on the board Sb. Or, where the first component placing head 43a is directed to help the second component placing head 43b in mounting the components within the interference risk zone Si on the board Sb, the productivity of the board Sb can be enhanced.

The component mountings by the placing heads 43a, 43b on the boards Sa, Sb in the second through fourth embodiments can be done in the same manner as described with reference to FIGS. 5-7 in the first embodiment. In the second through fourth embodiments, the component picked up from the first component supply device 45a is mounted on the board Sa, while the component picked up from the second component supply device 45b is mounted on the board Sb. However, as the case may be, the component picked up from the first component supply device 45a may be mounted on the board Sb, while the component picked up from the second component supply device 45b may be mounted on the board Sa. Moreover, the component mounting apparatus may be designed to be provided with one component supply device 45a or 45b only, and components may be picked up only from the single component supply device thereby to mount them on both of the boards Sa, Sb.

(Fifth Embodiment)

Next, the fifth embodiment shown in FIGS. 13 to 17 will be described. This embodiment uses a component mounting apparatus composed of the two board transfer devices 10a, 10b, the two component supply devices 45a, 45b and the component placing device 40 including the two component placing heads 43a, 43b. Table 1 below exemplifies one example of the process steps in the case of mounting components on the boards of three kinds or types A, B and C.

TABLE 1

| Order of Production | Width of Board | Number of Production |
| --- | --- | --- |
| A | 10 | 500 |
| B | 15 | 70 |
| C | 10 | 100 |

With respect to the order of production, it is assumed that first of all, the productions of the two types of boards A and B are started by transferring the type-A boards on the first board transfer device 10a and at the same time, by transferring the type-B boards on the second board transfer device 10b, and that then, two types of boards A and C are produced by transferring the type-C boards on the second board transfer device 10b after completion of the type-B board production and by continuing transferring the type-A boards on the first board transfer device 10a.

Figure 13:
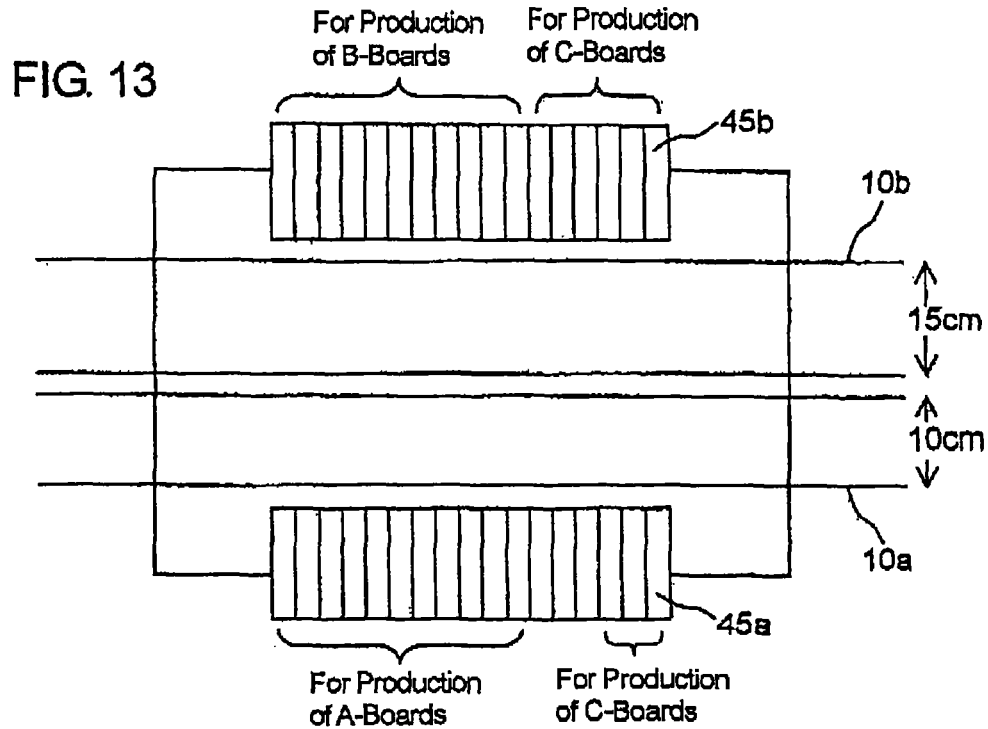
FIG. 13 is a rough plan view explaining the operation of the apparatus in the fifth embodiment.

In this case, prior to the production start, as shown in FIG. 13, the respective conveyor width adjusting devices 30, 30 are operated to set the transfer way width of the first board transfer device 10a to 10 centimeters and that of the second board transfer device 10b to 15 centimeters. Further, the feeders for the type-A board production are set on the feeder table of the first component supply device 45a, the feeders for the type-B board production are set on the feeder table of the second component supply device 45b, and the feeders for the type-C board production are set primarily on the feeder table of the second component supply device 45b. In the illustrated example in FIG. 13, since the feeders for the type-C board production cannot be set all on the feeder table of the second component supply device 45b, some of the feeders for the type-C board production are set on the feeder table of the first component supply device 45a.

Figure 14:
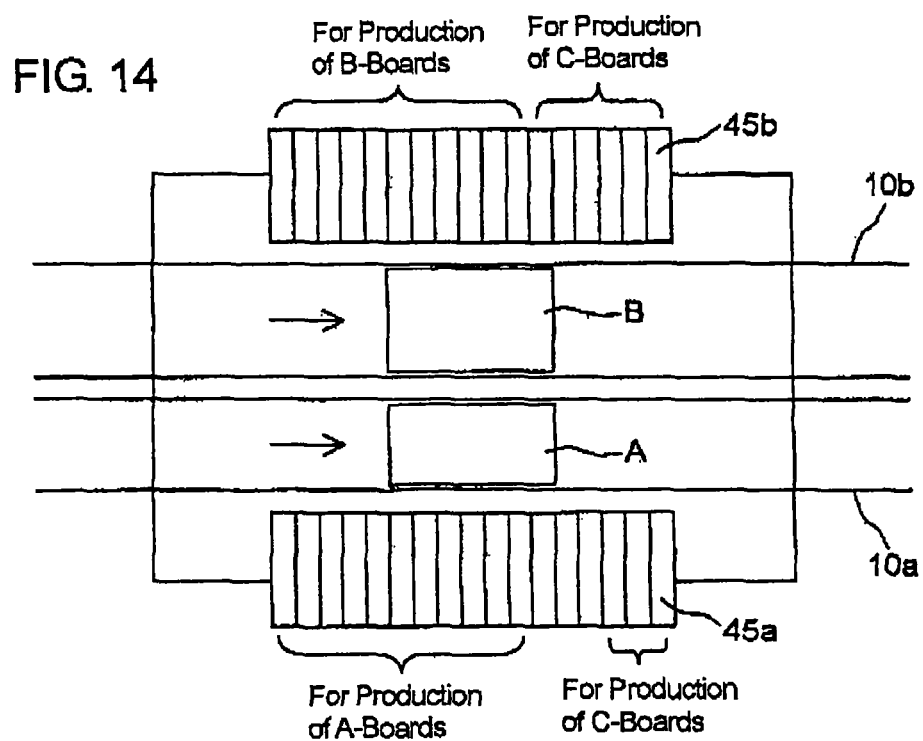
FIG. 14 is another rough plan view explaining the operation of the apparatus in the fifth embodiment.

In the production, as shown in FIG. 14, the first board transfer device 10a successively loads the type-A boards, and the first component placing head 43a (not shown) successively mounts designated components on each of the loaded type-A boards. In parallel time relation with this, the second board transfer device 10b successively loads the type-B boards, and the second component placing head 43b (not shown) successively mounts designated components on each of the loaded type-B boards. In this production example, in order to obviate the physical interference between the both component placing heads 43a and 43b in mounting components within the interference risk zones Si, Si on the type-A and type-B boards, the stop positions in the transfer directions on the transfer devices 10a, 10b may be set to be different from each other, as exemplified in FIG. 9.

Figure 15:
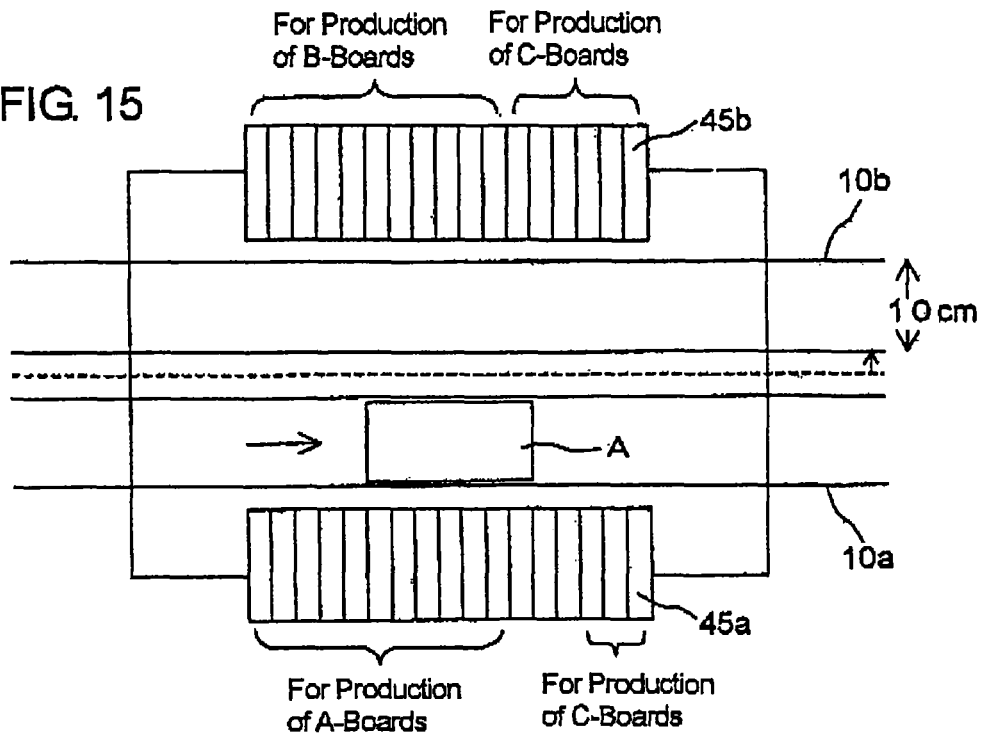
FIG. 15 is still another rough plan view explaining the operation of the apparatus in the fifth embodiment.

After completion of the type-B board production, as shown in FIG. 15, the transfer way width of the second board transfer device 10b is altered by the conveyor width adjusting device 30 thereof from 15 centimeters to 10 centimeters in parallel time relation with the component mountings on the type-A boards. During the alteration operation, the second component placing head 43b may be retracted to a shunting or turnout position. However, if the second component placing head 43b is caused to help the first component placing head 43a in mounting the components on the type-A boards, the productivity can be heightened. In this latter case, the two component placing heads 43a and 43b have to be controlled to obviate the interference therebetween.

Figure 16:
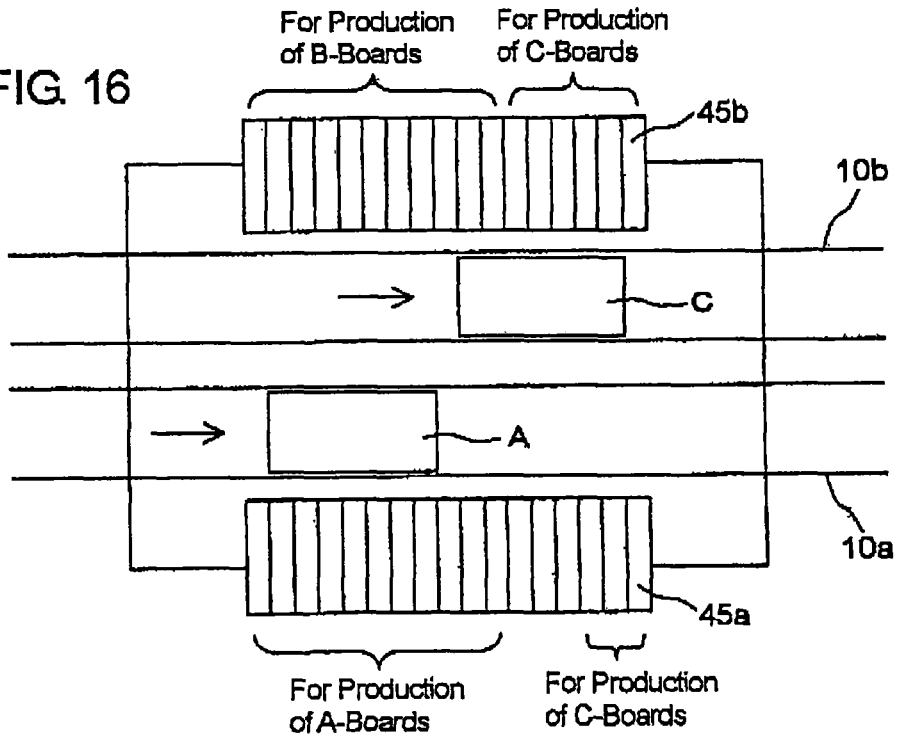
FIG. 16 is a further rough plan view explaining the operation of the apparatus in the fifth embodiment.
Figure 17:
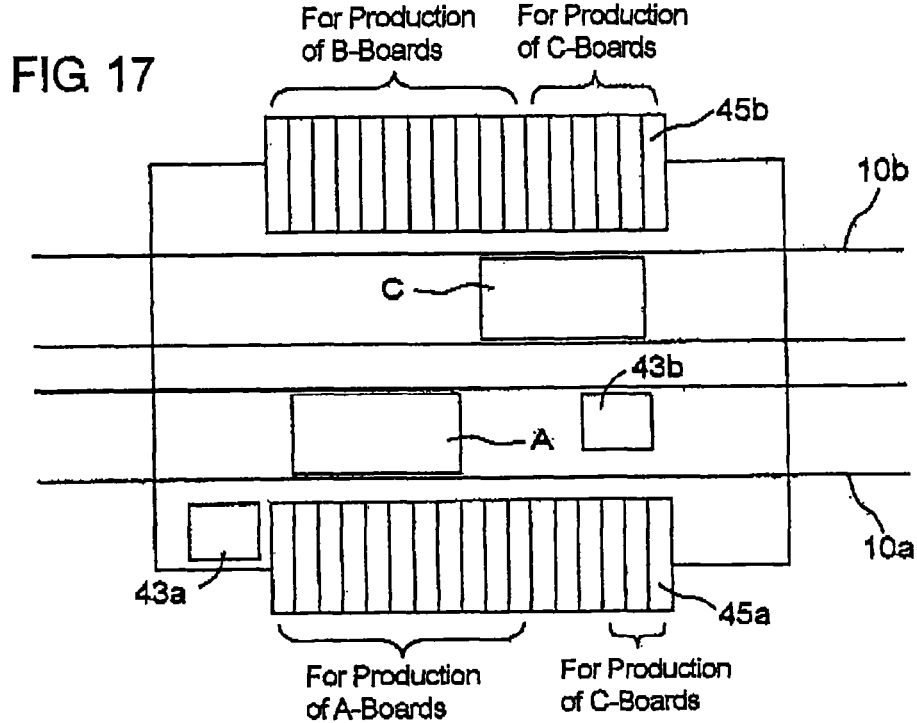
FIG. 17 is a still further rough plan view explaining the operation of the apparatus in the fifth embodiment.

Upon termination of altering the transfer way width of the second board transfer device 10b, as shown in FIG. 16, the mountings by the second component placing head 43b of the components are performed on the type-C boards successively loaded by the second component transfer device 10b, in parallel time relation with the mountings by the first component placing head 43a of the components on the type-A boards. Where the feeders for the components to be mounted on the type-C boards have been set on the feeder table at the side of the first component supply device 45a, the chance for the both component placing heads 43a and 43b to interfere with each other increases, and therefore, measures have to be taken to obviate the interference. In order to take such measures, in the illustrated embodiment in FIG. 16, the stop positions of the type-A and type-C boards are made to be different from each other, and the feeders for the type-A boards and those for the type-C boards are arranged with some space (e.g., several vacant or non-use feeders) therebetween. If the measures are imperfect, as shown in FIG. 17, a shunting or turnout control is executed, for example, to retract the first component placing head 43a temporally to a turnout position when the second component placing head 43b is about to move towards the feeders at the side of the first component supply device 45a for picking up the components therefrom. Of course, the control to obviate the interference becomes unnecessary after termination of the type-A board production.

Where the boards of a different type are to be produced on the first board transfer device 10a in succession to the termination of the type-A board production, the first component placing head 43a is caused to wait at the turnout position or to help the second component placing head 43b in mounting the components on the type-C boards until the first of such a different type boards is loaded onto the first board transfer device 10a. Also when the programmed production schedule is completed, the first component placing head 43a is caused to wait at the turnout position or to help the second component placing head 43b in mounting the components on the type-C boards.

(Sixth Embodiment)

Next, the sixth embodiment will be described with reference to FIGS. 18 and 27. This embodiment uses a component mounting apparatus composed of the two board transfer devices 10a, 10b, the two component supply devices 45a, 45b and the component placing device 40 including one or the two component placing heads 43a, 43b. Of the two board transfer devices 10a, 10b, one of them is set or assigned as regular type product transfer device exclusively used for transferring boards for the regular type products, and the other of them is set or assigned as interruption or break-in product transfer device used primarily for transferring boards for interruption or break-in products which are different in board width from those for the regular type products.

In the course of the production according to a schedule that a plurality of the type-A products are to be produced, a command to produce the type-B products on an urgent, break-in basis may be input to the controller 60 from the host computer. In such a case, if the both of the board transfer devices 10a, 10b which have been arranged for the regular type products were rearranged for the break-in products, much loss time would be taken to make the rearrangement. In particular, where the number of the break-in products to be produced is small, the loss time would become much larger if both of the board transfer devices 10a, 10b were rearranged at the same time.

In this particular embodiment, in order to reduce the time taken to make the rearrangement, one of the board transfer devices 10a (or 10b) is assigned as regular type product transfer device used exclusively for transferring the boards for the regular type products, while the other transfer device 10b (or 10a) is assigned as break-in product transfer device for primarily transferring the boards for the break-in products which are different in board width from those for the regular type products. As setting means for making this assignment, for example, the memory unit 63 is provided with setting areas which correspond respectively to the board transfer devices 10a, 10b. When a selected one of the board transfer devices is to be assigned as the regular type product transfer device, numeral "1" is set in the setting area associated thereto, or when it is to be assigned as the break-in product transfer device, numeral "0" is set therein. For example, where the board transfer devices 10a and 10b are to be assigned respectively as the regular type product transfer device and the break-in product transfer device, numerals "1" and "0" are input from the input unit 64 of the controller 60 to the setting areas of the memory unit 63 respectively associated with the board transfer devices 10a, 10b. And, the feeders retaining the components for the regular type products are exclusively set in the component supply device 45a at the side of the board transfer device 10a, while vacant slots prepared for use in setting the feeders retaining the components for the break-in products are left in the components supply device 45b at the side of the board transfer device 10b.

When a command for production of the break-in products (i.e., type-B products) is input from the host computer to the controller 60 (Step 132 in FIG. 27) in the course of the ordinary production wherein the boards for the regular type products (i.e., type-A boards) are transferred on both of the board transfer devices 10a, 10b and wherein the regular type products (i.e., type-A products) are under the ordinary production at the both of the board transfer devices 10a, 10b (Step 131), the board transfer device 10b prepared for the break-in products stops loading a successive type-A board and performs the processing to discharge the type-A board now thereon. (Step 133) The mounting program for mounting the components on the board transferred by the board transfer device 10b to the component mounting position is changed from a type-A product mounting program to a type-B product mounting program. (Step 134) Then, the transfer way width of the board transfer device 10b in a direction perpendicular to the transfer direction is altered to meet a rail-to-rail width corresponding to the type-B boards. (Step 135) Thereafter, it is judged whether or not, the component mountings on the type-A boards at the board transfer device 10a and the component mountings on the type-B boards at the board transfer device 10b cause the interference between the component placing heads 43a, 43b so that such simultaneous mountings are impossible. (Step 136) If possible, the component mountings on the type-A boards at the board transfer device 10a and the component mountings on the type-B boards at the board transfer device 10b are carried out simultaneously. (Step 137) Where the simultaneous productions are impossible, on the contrary, the component mountings at the board transfer device 10a are halted, during which time the component mountings on the type-B boards are carried out at the board transfer device 10b until the number of the type-B boards reaches a commanded number. (Step 138) When the component mountings on the type-B boards of the commanded number are completed (Step 139), the board transfer device 10a is restored to the production for the type-A products, and the type-A products are produced as ordinary on both of the board transfer devices 10a, 10b.

(Seventh Embodiment)

Next, the seventh embodiment will be described with reference to FIGS. 19 and 20. In this embodiment, where the boards on which the component mountings are to be carried out at the board transfer devices 10*a*, 10*b* are changed from the first type product boards (e.g. type-A boards) to the second type product boards (e.g. type-B boards), component mountings on a trial basis are carried out at the board transfer devices 10*a*, 10*b*, and unless any problem is given rise to, the mounting operations of the purpose are started. Where the component mountings on the type-B boards are started immediately after the component mountings on the type-A boards are completed at the board transfer devices 10*a*, 10*b*, it is often the case that the type-B boards with the components so mounted thereon have defects in quality. This gives rise to faulty products and a time loss in production. Therefore, it has been a practice on production sites that prior to such change in production, prior trial mountings of components are performed on the type-B boards at the board transfer device which is to be used after the change in production. However, taking into account the fact that the condition of the component mounting apparatus changes as time expires long after the trial mountings and that reconfirmation has to be made as to whether the feeders necessary for mounting components on the type-B boards have been set on the component mounting apparatus, it is preferable to perform the trial basis mountings right before the full-scale basis production of the type-B products. In this viewpoint, in this particular embodiment, by taking the advantage that the component mounting apparatus is provided with the two board transfer devices 10*a*, 10*b*, component mountings on a trial basis are started on the type-B boards at one of the board transfer devices 10*b* (or 10*a*), during which time component mountings on a full-scale basis are continued on the type-A boards at the other transfer device in parallel time relation.

Figure 19:
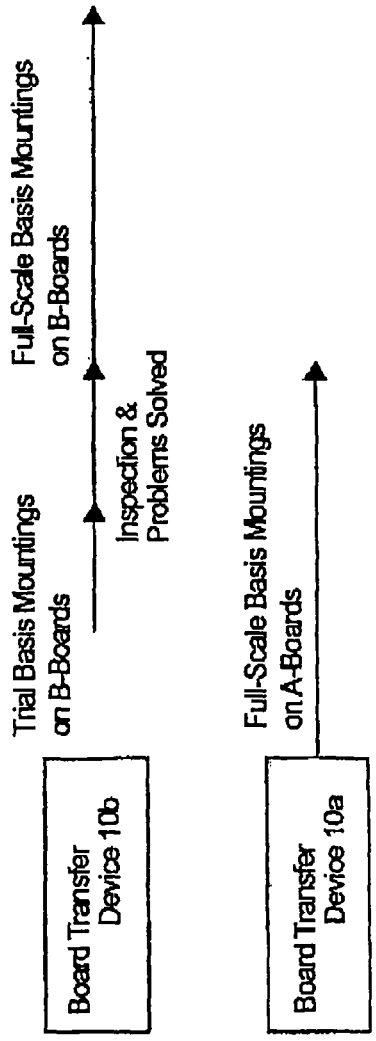
FIG. 19 is a time chart explaining a trial basis mounting operation of the apparatus in the seventh embodiment during the production employing one of two board transfer devices.

As shown in FIG. 19 for example, it is now assumed that the board transfer device 10*a* has been set as the regular type product transfer device, while the board transfer device 10*b* has been set as the break-in product transfer device and that one-side production is being performed wherein the full-scale basis production of the first regular type products is carried out on the first regular type boards (type-A boards) at the board transfer device 10*a*, while no component mounting operation is being carried out at the board transfer device 10*b*. It is further assumed that another one-side production is further commanded for performing component mountings on the boards (type-B boards) for the second regular type products while the preceding one-side production is being carried out for component mountings on the first regular type boards (type-A boards) at the board transfer device 10*a*. In this case, there is set a mounting program for performing component mounting operations on the type-B boards at the board transfer device 10*b*, and the rail-to-rail width of the board transfer device 10*b* is adjusted or altered to correspond to the type-B boards. Thus, the full-scale basis mountings of components are performed on the type-A boards at the board transfer device 10*a*, and the trial basis mountings of components are performed on the type-B boards at the board transfer device 10*b*. Where the change from the first regular type products to the second regular type products has been determined in dependence upon the production schedule, the timing when the trial basis component mountings are to be started is determined taking into account the progress in production of the first regular type products, the time period for the trial basis production of one or several second regular products and the time period necessary for inspection and reworking on the one or several products produced on the trial basis. Where the change to the second regular type products is suddenly instructed, the trial basis component mountings on the boards for the second regular type products are started at the time point at which the change command is given. The type-B boards (one or several) with components mounted thereon are unloaded from the board transfer device 10*b* and are inspected. The inspection is carried out with respect to such items as mounting position, wrong components, setting error of feeders, mounting position accuracy and so on. If any problem arises as a result of the inspection, modifications concerning such faulty items are made for the adjustment in component mountings on the type-B boards at the board transfer device 10*b*, the change in the set feeders and the like. After the problems are all solved, the component mountings on the type-B boards are started on the full-scale basis at the board transfer device 10*b*, and the component mountings on the type-A boards at the board transfer device 10*a* are terminated when the type-A products of a scheduled number are attained. Thereafter, in order that the setting change is performed to set the board transfer device 10*b* as the regular type product transfer device and the board transfer device 10*a* as the break-in product transfer device, numerals "1" and "0" are input from the input device 64 respectively to the setting areas for the board transfer devices 10*a*, 10*b* of the memory unit 63 of the controller 60.

Figure 20:
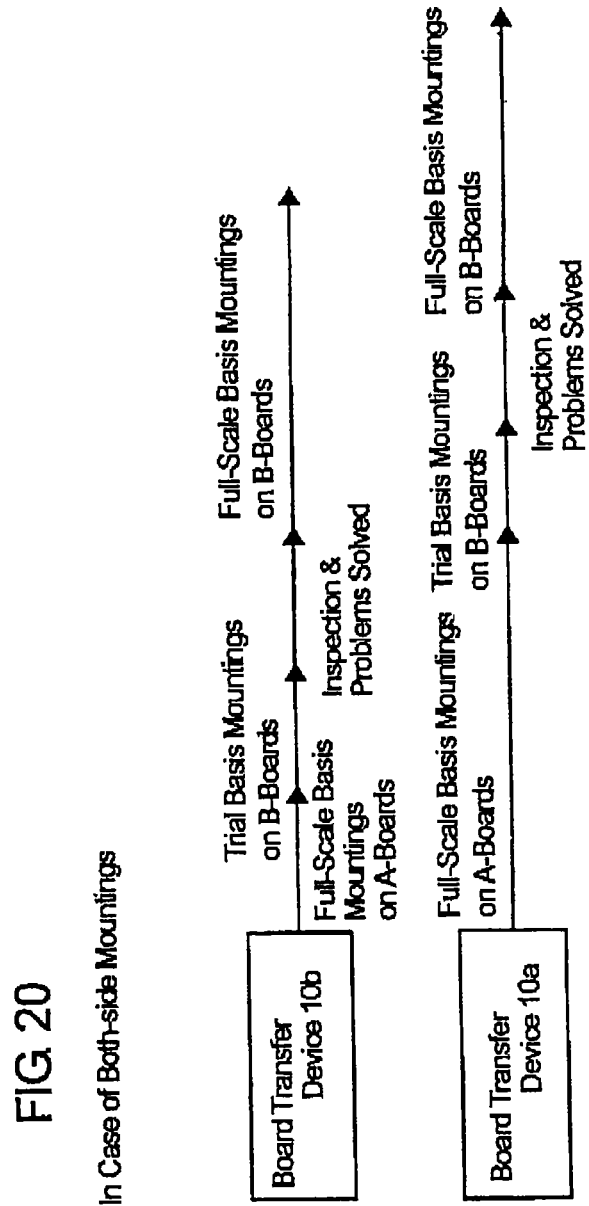
FIG. 20 is a time chart explaining a trial basis mounting operation of the apparatus in the seventh embodiment during the production employing both of the two board transfer devices.

It is now assumed that as shown in FIG. 20, the both-side productions are being performed to mount components on the boards (type-A boards) for the first regular type products at both of the board transfer device 10*a*, 10*b* on a full-scale basis wherein the board transfer device 10*a* has been set as the regular type product transfer device while the board transfer device 10*b* has been set as the break-in product transfer device. When in this state, another both-side production command is given for mounting components on the boards (type-B boards) for the second type products on a full-scale basis, the board transfer device 10*b* stops loading a further type-A board thereto and unloads the type-A board remaining thereon immediately or upon completion of the mountings of all the components therefore in order that the trial basis mountings of components on the type-B boards can be done at the board transfer device 10*b*. Then, the mounting program for component mountings at the board transfer device 10*b* is changed from the mounting program for the type-A boards to that for the type-B boards, and the rail-to-rail width of the board transfer device 10*b* is adjusted to correspond to the type-B boards. Thus, the component mounting operations are carried out on the type-A boards at the board transfer device 10*a* on the full-scale basis and on the type-B boards at the board transfer device 10*b* on the trial basis. One or several type-B boards each with components mounted thereon are unloaded from the board transfer device 10*b* and are inspected. If any problem arises as a result of the inspection, modifications are made concerning the faulty items, and thereafter, the component mountings are carried out on the type-B boards at the board transfer device 10*b* on the full-scale basis. In due course, the type-A boards with the components mounted at the board transfer device 10*a* reach the scheduled number, and then, the component mountings of the type-B boards on the trial basis are performed at the board transfer device 10*a* in the same manner as done at the board transfer device 10*b*. Subsequently, the component mountings on the type-B boards on the full-scale basis are started after any problem is found out and solved.

(Eighth Embodiment)

Next, the eighth embodiment will be described. This embodiment uses a component mounting apparatus composed of the two board transfer devices 10*a*, 10*b*, the two component supply devices 45a, 45b and the component placing device 40 including the two component placing heads 43a, 43b and aims at decreasing the chance for the two component placing heads 43a, 43b to interfere with each other in performing the both-side productions.

Figure 21:
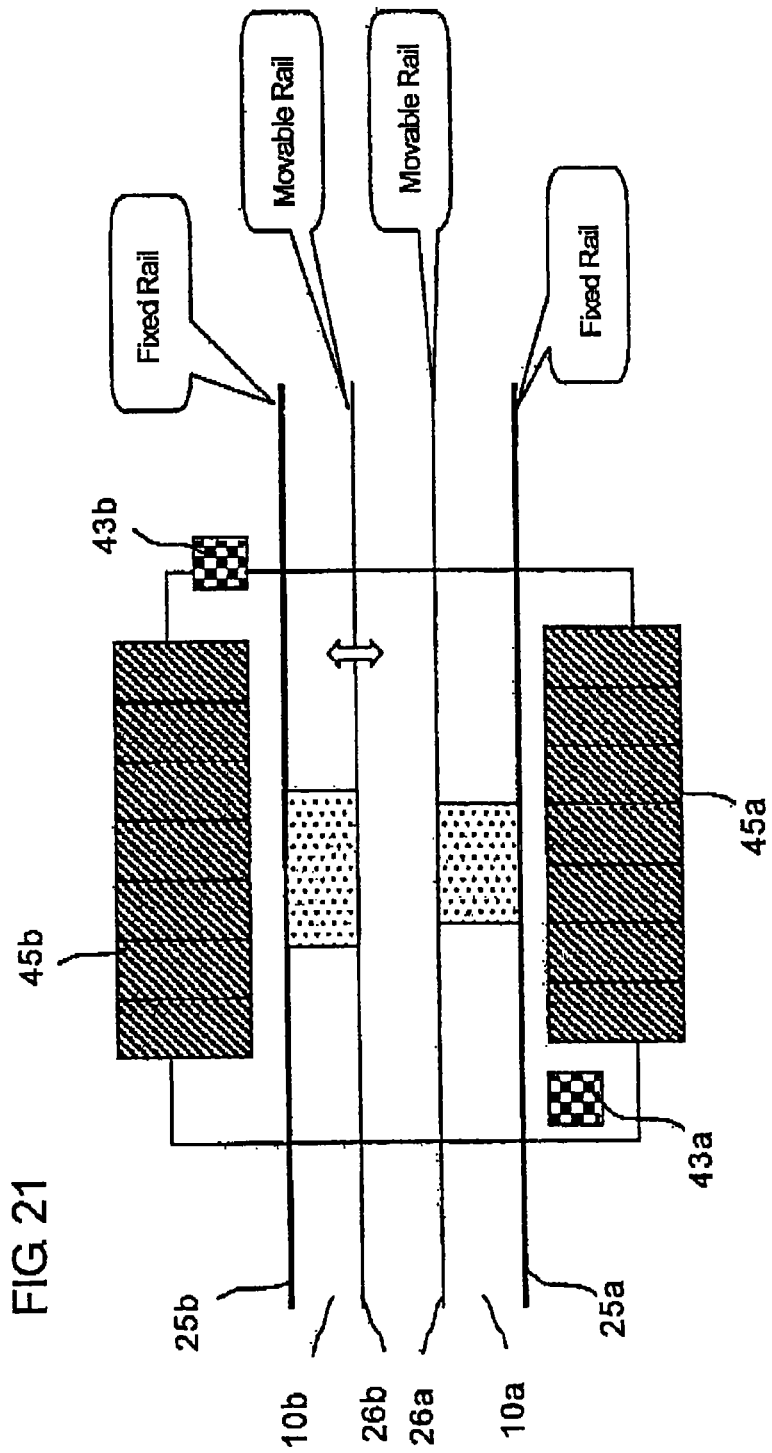
FIG. 21 is a rough plan view explaining the operation of the apparatus in the eighth embodiment.

As shown in FIGS. 2 and 21, the two board transfer devices 10a, 10b are juxtaposed for transferring the boards in the respective transfer directions parallel to each other, and the two components supply devices 45a, 45b are arranged respectively at the outsides opposite to the center side or portion where the board transfer devices 10a, 10b adjoin to each other. The board transfer devices 10a, 10b are provided with respective pairs of the guide rails 25a, 26a and 25b, 26b each pair for guiding the both sides of boards transferred therealong. The support rails 20, 20 and the side rails 14, 14 which constitute the outside guide rails 25a, 25b respectively adjacent to the component supply devices 45a, 45b are secured to the outside support pedestals 12, 12 upright fixed on the base 11. On the other hand, the support rails 20, 20 and the side rails 14, 14 which constitute the center side guide rails 26a, 26b are secured to the inside support pedestals 12a, 12a which are supported and guided on the base 11 each for position adjustment in the direction perpendicular to the direction in which the guide rails extend. The inside support pedestals 12a, 12a are movable respectively by the first and second drive motors 33, 37 through the first and second screw shafts 31, 35 in accordance with the commands from the controller 60, so that the center side guide rails 26a, 26b are adjusted in position in the direction perpendicular to the lengthwise directions thereof to alter the transfer way width or the rail-to-rail width of each board transfer device 10a or 10b in correspondence to the boards transferred therealong. The guide rail position adjusting means (i.e., the conveyor width adjusting devices 30) for adjusting the positions of the center side guide rails 26a, 26b is composed of the inside support pedestals 12a, 12a, the first and second drive motors 33, 37, the first and second screw shafts 31, 35, the controller 60 and the like. Thus, where the distance or space between the two guide rails 25a, 26a or 25b, 26b is adjusted to be narrow, an extra space is made between the movable guide rails 26a and 26b which are at the center side of the board transfer devices 10a, 10b. This extra space advantageously results in setting the two boards on the transfer devices 10a, 10b apart from each other, so that the chance for the two component placing heads 43a, 43b to interfere with each other can be minimized.

In a modified form of the invention, in the same manner as the inside support pedestals 12a, 12a are done, the outside support pedestals 12, 12 may be slidably guided on the base 11 and may be movable by drive servomotors through screw shafts thereby to make the outside guide rails 25a, 25b adjustable by the position adjusting means in the direction perpendicular to the lengthwise direction of the outside guide rails 25a, 25b. In this modified form, it becomes realized to make a larger extra space at the center side of the board transfer devices 10a, 10b, so that the chance for the two component placing heads 43a, 43b to interfere with each other can be minimized more reliably. This can be done by positioning the outside guide rails 25a, 25b at the outmost positions respectively closest to the component supply devices 45a, 45b and by adjusting the center side guide rails 26a, 26b to set the rail-to-rail width of each board transfer device 10a or 10b in correspondence to the width of the boards transferred therealong. Further, in this modified form of the embodiment, it becomes realized to shorten the moving distances of the component placing heads 43a, 43b and to obviate the interference therebetween. To this end, a prior judgment is made of whether or not, any feeder for the components to be mounted on the boards transferred by the board transfer devices 10a, 10b has been set in the component supply device 45b or 45a located at the remote side. And, where it can be confirmed that any such feeder has been set only in the component supply device 45b or 45a located at the closer side, the outside guide rails 25a, 25b are controlled to be positioned closest to the component supply device 45b or 45a, as mentioned earlier.

Hereinafter, a component mounting system which employs the component mounting apparatus described with reference to FIGS. 1 to 4 for use in a production line will be described in the following ninth and tenth embodiments.

(Ninth Embodiment)

Figure 22:
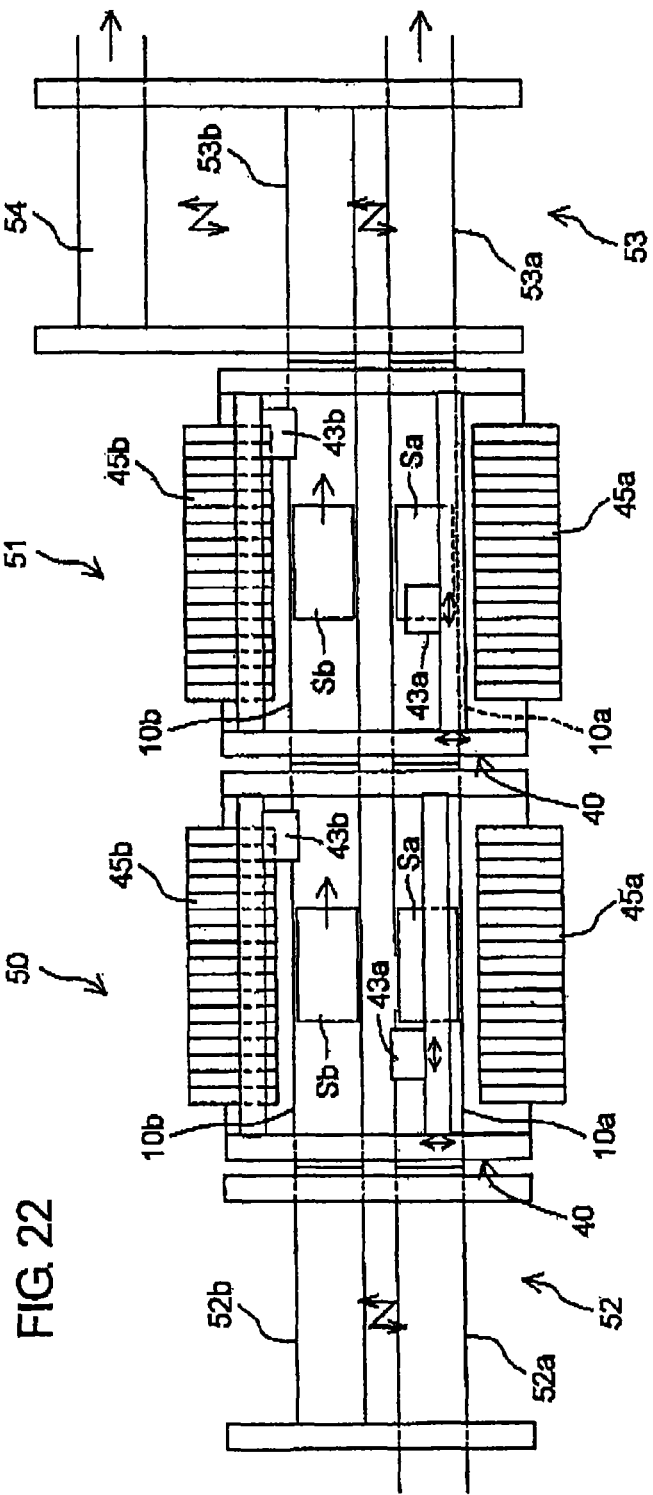
FIG. 22 is a rough plan view explaining the operation of an electronic component mounting system in the ninth embodiment according to the present invention.

In the component mounting system of the ninth embodiment, as shown in FIG. 22, there is used a production line or a part thereof, wherein two mounting stations 50, 51 each comprising the aforementioned component mounting apparatus are arranged in series, and wherein a first shifting device 52 is arranged at the loading side of the first mounting station 50, while a second shifting device 53 is arranged at the unloading side of the second mounting station 51. The first shifting device 52 is provided with first and second entrance side board transfer devices 52a, 52b each having the same conveyor width adjusting device 30 as provided to the board transfer devices 10a, 10b, and the second shifting device 53 is provided with first and second exit side board transfer devices 53a, 53b respectively having the same configurations as the first and second entrance sides board transfer devices 52a, 52b. The first entrance side board transfer device 52a of the first shifting device 52, the first board transfer devices 10a, 10a of the two mounting stations 50, 51 and the first exit side board transfer device 53a of the second shifting device 53 are connected in series in the longitudinal direction of the system, with the respective transfer way widths being kept by the conveyor width adjusting devices 30 associated thereto in coincidence with one another. Similarly, the second entrance side board transfer device 52b, two second board transfer devices 10b, 10b and the second exit side board transfer device 53b are connected in series in the longitudinal direction of the system, with the respective transfer way widths being kept in coincidence with one another. Thus, the boards are movable successively on the first transfer devices 52a, 10a, 10a and 53a at one side independently of those which are movable successively on the second transfer devices 52b, 10b, 10b and 53b at the other side. Because the first and second transfer devices 10a, 10b of each mounting station 50, 51 are adjusted to bring their transfer way widths into coincidence with each other, each board can be loaded by the first shifting device 52 selectively into the first and second transfer devices 10a, 10b and can be unloaded by the second shifting device 53 to merge into the first exit side board transfer device 53a.

In accordance with a command from the controller 60, the first shifting device 52 classifies the boards of plural kinds or types loaded from a preceding production station into the boards Sa to be sent onto the first board transfer device 10a and those Sb to be sent onto the second board transfer device 10b and feeds the former, as they are, onto the first board transfer device 10a of the first mounting station 50 and the latter onto the second board transfer device 10b of the first mounting station 50 after shifting them to the second entrance side board transfer device 52b. That is, the first shifting device 52 is provided with an entrance side shifting mechanism for performing such shifting motion. In FIG. 22, the shifting mechanism is represented by an arrow of the shape "N" and for the sake of brevity, is omitted from being described in detail. Although the first entrance side board transfer device 52a in FIG. 22 is illustrated to load the boards from the preceding production station, the second entrance side board transfer device 52b may be to load the boards from the preceding production station in place of the first entrance side board transfer device 52a. Moreover, the boards from the preceding production station may be loaded onto both of the entrance side board transfer devices 52a, 52b, in which case the entrance side shifting mechanism may be a little different in specific function and construction from that aforementioned.

In accordance with a command from the controller 60, the second shifting device 53 selects those boards which are still to have components mounted thereon continuously, from the boards Sa, Sb loaded from the mounting stations 50, 51 onto the exit side board transfer devices 53a, 53b and shifts such those boards onto a first exit side board transfer device 53a to transfer them to a succeeding mounting station (not shown). Likewise, the second shifting device 53 shifts those boards with which the component mounting operations have been completed, onto the board discharge device 54 to discharge them from the system. That is, the second shifting device 53 includes an exit side shifting mechanism for performing such shifting motion. In FIG. 22, the exit side shifting mechanism is represented by an arrow of the shape "N" and for the sake of brevity, is omitted from being described in detail.

The production line in this ninth embodiment is designed to be operated in either one of first and second production modes selectable as described hereinafter. In the first production mode, the first shifting device 52 classifies the boards Sa, Sb of plural kinds or types loaded from the preceding production station onto the first entrance side board transfer device 52a, into the boards Sa on which components are to be mounted at the first board transfer devices 10a, 10a of the mounting stations 50, 51 and into those Sb on which components are to be mounted at the second board transfer devices 10b, 10b of the mounting stations 50, 51. Then, the first shifting device 52 feeds the former Sa into the first board transfer device 10a of the first mounting station 50 and feeds the latter Sb into the second board transfer device 10b of the first mounting station 50. Thus, the boards Sa, Sb have components mounted thereon by the component mounting apparatus of the mounting stations 50, 51 and then, are sent out to the exit side board transfer devices 53a, 53b of the second shifting device 53. Thereafter, those boards Sa, Sb on which the component mountings are further required are transferred from the first exit side board transfer device 53a onto the succeeding mounting station (not shown), while other boards Sa, Sb on which the component mountings have been completed are discharged from the board discharge device 54.

In the second production mode, the first shifting device 52 classifies the boards Sa, Sb of plural kinds or types loaded from the preceding production station onto the first entrance side board transfer device 52a, into the boards Sa on which component are to be mounted at the first board transfer devices 10a, 10a of the mounting stations 50, 51 and into those Sb on which any component is not to be mounted at the mounting stations 50, 51. Then, the first shifting device 52 feeds the former Sa onto the first board transfer device 10a of the first mounting station 50 and feeds the latter Sb onto the second board transfer device 10b of the first mounting station 50. Thus, the boards Sa have components mounted thereon at the first board transfer devices 10a, 10a of the mounting stations 50, 51 and then, are sent out to the first exit side board transfer device 53a of the second shifting device 53. On the other hand, the boards Sb are fed by the respective second board transfer devices 10b, 10b to pass through the respective component mounting apparatus of the respective mounting stations 50, 51 without being stopped thereat and are sent out to the second exit side board transfer device 53b of the second shift device 53. And, in the same way as the first production mode, the boards Sa, Sb on which the component mountings are further required are unloaded from the first exit side board transfer device 53a to the succeeding mounting station, while the boards Sa, Sb on which the component mountings have been completed are discharged from the board discharge device 54. In this second production mode, the respective second board transfer devices 10b, 10b of the both mounting stations 50, 51 are utilized as bypass conveyor for enabling the boards Sb on which any component is not mounted at the first board transfer devices 10a, 10a, to bypass the same.

In the first production mode of the ninth embodiment, even where the boards Sa, Sb of plural kinds or types are loaded in a random order or sequence, they are automatically fed to the corresponding board transfer devices 10a, 10b to have components mounted thereon by the component mounting apparatus, so that flexibility can be increased in the production of the circuit boards. In the second production mode, on the contrary, the boards on which the component mounting is unnecessary at a certain mounting station can bypass such a certain mounting station to be sent forward. Thus, it does not take place that the boards remain stopped in the mid course of the production line, so that the productivity of the boards can be enhanced.

Furthermore, in a production line connecting plural component mounting apparatus in series as shown in FIG. 22, it is often the case that when the component placing device 40 of a certain component mounting apparatus runs into difficulties, the production line usually falls in shutdown as a whole. However, if the second production mode is applied to the component mounting apparatus running into the difficulties, thereby to cause the boards to bypass the troubled apparatus, the component mounting operations can be continued in other component mounting apparatus than that running into the difficulties, so that it advantageously does not take place to bring the entirety of the production line into shutdown.

(Tenth Embodiment)

Next, the tenth embodiment will be described with reference to FIG. 23. This embodiment is constituted by partly modifying the configuration of the ninth embodiment shown in FIG. 22. That is, the first shifting device 52 arranged at the loading side of the first mounting station 50 in the ninth embodiment is replaced by a shifting device 55, the second shifting device 53 in the ninth embodiment is replaced by a shifting device 56 with an inspection station, and the board transfer devices 10b, 10b are additionally given a function for returning the boards from the second exit side board transfer device 56b to the second entrance side board transfer device 55b.

The shifting device 55 takes almost the same configuration as the first shifting device 52 in the ninth embodiment, but in addition to the function of the first shifting device 52, is further given another function for shifting the boards which were returned from the shifting device 56 with the inspection station via the second board transfer devices 10b, 10b of the first and second mounting stations 50, 51, to the first entrance side board transfer device 55a thereby to send the returned boards to the first board transfer device 10a of the first mounting station 50.

The shifting device 56 with the inspection station has almost the same construction as the second shifting device 53 in the ninth embodiment. In addition to the foregoing function of the same, the shifting device 56 is given another function for inspecting the boards Sa loaded onto the first exit side board transfer device 56a from the mounting stations 50, 51, transferring to the second board transfer device 10b of the second mounting station 51 any of the boards which lacks some components to mount thereon but is able to have the lacked components remounted thereon, and transferring to a board discharge device 57 the remaining boards which also lack some components to mount thereon, but are no longer able to have the lacked components remounted thereon.

The production line in this tenth embodiment is designed to be operated selectively in first and second production modes, as described hereinafter.

In the first production mode, in the same manner as the foregoing ninth embodiment operates in the first production mode, the shifting device 55 classifies the boards Sa, Sb of plural kinds or types loaded from the preceding production station (not shown) onto the first entrance side board transfer device 55a, into two groups as previously defined in the ninth embodiment and send the groups respectively to the first board transfer device 10a and the second board transfer device 10b of the first mounting station 50.

Thus, the boards Sa, Sb have components mounted thereon by the component mounting apparatus of the mounting station 50, 51 and then, are sent out to the first and second exit side board transfer devices 56a, 56b of the shifting device 56 with the inspection station. The boards Sa, Sb on which components are further to be mounted are unloaded from the first and second exit side board transfer devices 56a to the succeeding mounting station (not shown), while other boards Sa, Sb on which the component mountings have been completed are discharged from the board discharge device 57.

In the second production mode, the first shifting device 55 sends all of the boards Sa loaded from the preceding production station onto the first entrance side board transfer device 55a, to the first board transfer device 10a of the first mounting station 50. The shifting device 56 with the inspection station inspects the boards Sa which are loaded to the first exit side board transfer devices 56a after having components mounted thereon at the first board transfer devices 10a, 10a of the mounting stations 50, 51. If some of the boards Sa have defects but are able to have components remounted thereon, the shifting device 56 returns such defective boards Sa to the second board transfer device 10b of the second mounting station 51. On the contrary, if some of the boards Sa have defects which are unable to cure, the shifting device 56 transfers such incurable, inferior boards to the board discharge device 57, and such boards are discharged from the production line as they are. The boards returned to the second board transfer devices 10b of the second mounting station 51 are further returned as curable boards Sb to the second entrance side board transfer device 55b by way of the second board transfer devices 10b, 10b of the respective mounting stations 51, 50 without being stopped in the course of such return feeding. At the same time as the return feeding, component lacking information concerning the curable boards is input from the inspection station of the shifting device 56 to the controller 60. The boards Sb returned to the second entrance side board transfer device 55b are shifted by the shifting device 55 under the control of the controller 60, onto the first entrance side board transfer device 55a and then, are sent in turn onto the first board transfer devices 10a, 10a of the both mounting stations 50, 51, whereby the components which were omitted are automatically remounted on these curable boards in accordance with the component lacking information having been input to the controller 60. In this second production mode, the second board transfer devices 10b, 10b within the mounting stations 51, 50 are used as return conveyor for returning the defective-but-curable boards Sb from the exit side shifting device 56 with the inspection station to the entranced side shifting device 55.

In the first production mode of this tenth embodiment, flexibility can be increased in the production of the circuit boards, as is true in the first production mode of the ninth embodiment. In the second production mode, on the other hand, where curable defects are developed on the boards Sa that are sent to the shifting device 56 with the inspection station after having components mounted at the first board transfer devices 10a, 10a of the both mounting stations 50, 51, such defects can be automatically detected at the inspection station of the shifting device 56, and the boards Sa possessing such curable defects are returned by the second board transfer devices 10b, 10b to the entrance side shifting device 55 preceding the mounting stations 51, 50, so that the missing components can automatically be remounted on the board Sa. Accordingly, because it becomes unnecessary to remount the omitted or missing components after the production of all the boards of the designated kind or type has been completed in the production line, the production control coping with the missing of components can be simplified.

Although in the aforementioned sixth and tenth embodiments, the component placing heads 43a, 43b of the component placing device 40 are exemplified as being of the XY type that they are movable in two directions parallel to the mounting surface of each boards Sa, Sb, they are not restricted or confined to such XY type. Instead, there may be employed a component placing device with a turret-type component placing head. Of course, each of the component placing head 43a, 43b may be provided with a suction nozzle unit with plural nozzles for holding a plurality of components thereon at the same time.

Further, in each of the foregoing embodiments, the two board transfer devices 10a, 10b are provided on each of the component mounting apparatus. With this configuration, the transfer way widths of the board transfer devices 10a, 10b can be altered each time the last board in one lot passes through the board mounting apparatus associated therewith, so that the production of boards in a successive lot can be initiated immediately. However, the present invention is not limited to this configuration. In a modified form, two board transfer device each of which goes through the entire production line, i.e., the plurality of the component mounting apparatus may be used instead of providing each component mounting apparatus with the two board transfer devices 10a, 10b.

Finally, various features and the attendant advantages of the foregoing embodiments are summarized as follows:

In the embodiment as described with reference to FIGS. 5, 6 and 24, components are mounted by the component placing device 40 simultaneously or alternately on two boards Sa, Sb transferred by the two board transfer devices 10a, 10b, so that the component mountings on each board can be done efficiently. Further, where the timings when the two board transfer devices 10a, 10b transfer the boards Sa, Sb are shifted from each other as shown in FIG. 6, it can be realized to perform the component mountings on one of the two boards Sa during the transferring of the other board Sb. This advantageously prevents the board transfer operation from causing the component mounting operations to be discontinued, so that the productivity of the boards Sa, Sb can be enhanced even though the number of components which can be mounted during unit time remains unchanged.

In the embodiment shown in FIGS. 1 and 2 for example, the two board transfer devices 10a, 10b are made as being of the linear transfer type and arranged in parallel relation with each other. The two component supply devices 45a, 45b are arranged at the outsides of the two board transfer devices 10a, 10*b*. Thus, the distances between the boards Sa, Sb loaded by the two board transfer devices 10*a*, 10*b* and the two component supply devices 45*a*, 45*b* are reduced in average, and therefore, the time taken for the component placing device 40 to mount components from the component supply device 45*a*, 45*b* onto the board Sa, Sb can be shortened, so that the productivity of the boards can be further enhanced.

As understood from the embodiment typically shown in FIG. 2, the board transfer devices 10*a*, 10*b* can adjust their transfer way widths in a direction perpendicular to the transfer direction of the boards Sa, Sb. Thus, the single component mounting apparatus has a capability of performing the component mountings on the boards of various kinds or types which are different in width from one another.

Where the single component placing 43 is used as described in the modified form shown in FIG. 5 for example, the component mounting apparatus can be simplified in construction and made to be suitable for the production of boards which are small in the number of components mounted thereon.

Also in the modified form, the single component placing head 43 is used in mounting components alternately on two boards Sa, Sb, as exemplified in FIG. 5 for example. Or, the single component placing head 43 is controlled to mount components alternately on two boards Sa, Sb at difference frequency, as exemplified in FIG. 7 for example. Thus, the efficiency in mounting components on two boards Sa, Sb at the respective transfer devices 10*a*, 10*b* can be enhanced.

Also in the embodiment exemplified in FIG. 6 for example, while either one of the two board transfer devices 10*b* is transferring a board Sb on which the component mountings have been completed, or the one board transfer device is adjusting the transfer way width thereof, the component placing device 40 (e.g., the single component placing head 43) performs the component mountings intensively on the board Sa at the other board transfer device 10*a*.

Where two placing heads 43*a*, 43*b* are provided as exemplified in FIG. 1 for example, they can be moved by the respective head moving mechanisms (i.e., 42*a*, 42*b*) independently of each other. Thus, with the increase in the placing head, the number of components which can be mounted during unit time period increases, so the productivity of the boards can be further enhanced.

In the embodiment exemplified in FIGS. 1 and 8 for example, one of the component mounting heads 43*a* is assigned for the component mountings mainly on one of the boards Sa held at the board transfer device 10*a*, while the other component mounting head 43*b* is assigned for the component mountings mainly on the other board Sb held at the board transfer device 10*b*. Thus, the program for controlling the operation of the component mounting apparatus can be simplified.

In a modified formed of the embodiment shown typically in FIG. 1, while either one of the two board transfer devices 10*a*(or 10*b*) is transferring the board Sa (or Sb) on which component mountings have been completed, or while either one of the two board transfer devices is being adjusted to alter the transfer way width thereof, one of the component placing head 43*a*(or 43*b*) which is dedicated to performing the component mountings on the board Sa (or Sb) at one of the two board transfer devices 10*a*(or 10*b*) helps the other component placing head 43*b*(or 43*a*) in performing the component mountings at the other board transfer device 10*b*(or 10*a*), so that the efficiency in mounting the components on the other board Sb (or Sa) can be enhanced.

In the embodiment exemplified in FIG. 9 for example, the component mounting positions to which the two boards Sa, Sb are transferred by the two board transfer devices 10*a*, 10*b* are set different from each other. Therefore, the chance for the two component mounting heads 43*a*, 43*b* to interfere with each other can be minimized, so that the efficiency of the component mountings can be enhanced, and at the same time, the program for controlling the operation of the board mounting apparatus can be simplified.

In the embodiment exemplified in FIGS. 8 and 10 for example, while one of the component placing head 43*a* (or 43*b*) is mounting components on one of the boards Sa (or Sb) within the predetermined interference risk zone Si, the other component placing head 43*b* (or 43*a*) is controlled to mount components on the other board Sb (or Sa) within an interference-free zone except for the interference risk zone Si. This advantageously minimizes the chance for the two component placing heads 43*a*, 43*b* to interfere with each other, so that the efficiency of mounting components on the boards can be enhanced.

In the embodiment exemplified in FIG. 12 for example, while either one of the two board transfer devices 10*b* (or 10*a*) is transferring the board Sb (or Sa) on which component mountings have been completed, or while either one of the two board transfer devices is being adjusted to alter the transfer way width thereof, the component placing head 43*a* mounts the components on the other board Sa at the interference risk zone Si which is adjacent to the center portion between both of the boards Sa, Sb. Thus, in simultaneously mounting components on two boards Sa, Sb respectively at the two board transfer devices 10*a*, 10*b*, the one of the component placing head 43*a* (or 43*b*) can perform the component mountings within the interference risk zone Si with the other component placing head 43*b* (or 43*a*) being retracted to a turnout or shunting place. Thus, the component mountings on two boards Sa, Sb can be done without the chance for the two component placing heads 43*a*, 43*b* to interfere with each other, so that the efficiency in mounting components on the boards can be enhanced. In the embodiment exemplified in FIGS. 18 and 27 for example, of the two board transfer devices 10*a*, 10*b*, one of them 10*a* is set as regular type product transfer device for transferring the boards for the regular type products, while the other transfer device 10*b* is set as break-in product transfer device for transferring the boards for interruption or break-in products which are different in board width from the regular type products. Thus, when a production command for the break-in products is given during the production of the regular type products, the other board transfer device 10*b* only can be prepared for the break-in products, so that the rearrangement or preparation of the other board transfer device 10*b* for the production of the break-in products can be done in a short time period at a low cost.

In the embodiment described with reference to FIGS. 20 and 27, where the regular type product in production is to be changed from the first regular type product (type-A) to the second type product (type-B), a trial basis production of the second type product (type-B) is performed at the other transfer device 10*b* which has been set for the break-in products, while the component mountings are being continued at one of the transfer devices 10*a*. And, if the trial basis production does not give rise to any problem, the other board transfer device 10*b* is set as the regular type product transfer device, and the component mountings on the boards for the second type products (type-B) are then performed on a full-scale basis, in connection with which a setting alteration is executed to set the one board transfer device 10*a* as the break-in product transfer device. In this way, any problem accompanied by the production of the second type products (type-B) can be extracted prior to the full-scale basis production thereof and without discontinuing the production operation by the component mounting apparatus. Therefore, the occurrence of poor quality after the starting of the full-scale basis production can be obviated, so that the change of the products from a certain type of products to another type of products can be made smoothly.

In the embodiment exemplified in FIGS. 20 and 27 for example, where the products on which the component mountings are being performed at both of the two board transfer devices 10*a*, 10*b* are to be changed from the first type product (type-A) to the second type product (type-B), a trial basis production of the second type product (type-B) is performed at the other transfer device 10*b* while the component mountings on the first type products (type-A) are being continued at one of the transfer devices 10*a*. And, if the trial basis production does not give rise to any problem, the component mountings on the boards for the second type products (type-B) are then performed on a full-scale basis. Thereafter, if any problem does not result from the trial basis component mounting operations on the second type products (type B) at the one board transfer device 10*a*, the component mountings on full-scale basis are initiated at the one board transfer device 10*a*. Therefore, any problem accompanied by the production of the second type products (type-B) can be extracted prior to the full-scale basis production thereof without discontinuing the production operation by the component mounting apparatus. Consequently, the occurrence of poor quality after the starting of the full-scale basis production can be obviated, so that the change of the products from a certain kind of products to another kind of products can be made smoothly.

In the embodiment exemplified in FIG. 21 for example, of the two guide rails 25*a*, 26*a* (or 25*b*, 26*b*) which are provided on each of the two board transfer devices 10*a*, 10*b* for guiding the both sides of the boards, each outside guide rail 25*a* (or 25*b*) adjacent to a corresponding one of the component supply devices 45*a*, (or 45*b*) is fixed, while each center side guide rail 26*a* (or 26*b*) is adjustably positioned in a direction perpendicular to the lengthwise direction of the rails. Thus, when the space between each two guide rails 25*a*, 26*a* (or 25*b*, 26*b*) is set to be narrow, the extra space is formed between the two movable rails 26*a*, 26*b* at the center side of each board transfer device 10*a*, 10*b*, and the two boards on the board transfer devices 10*a*, 10*b* are sufficiently separated with the extra space, so that the chance for the two component placing heads 43*a*, 43*b* to interfere with each other can be minimized.

In a modified form of the embodiment illustrated in FIG. 21, the two board transfer devices 10*a*, 10*b* for transferring the boards in respective directions parallel to each other guide the both sides of each board with two guide rails thereof. All the guide rails 25*a*, 26*a*, 25*b*, 26*b* are adjustable to be altered by the guide rail position adjusting means 30 (FIG. 2) in a direction perpendicular to the lengthwise or longitudinal direction thereof. The guide rail position adjusting means 30 positions the outside guide rails 25*a*, 25*b* at the side of the component supply devices 45*a*, 45*b*, to the positions closest to the component supply devices 45*a*, 45*b* and also positions the center side guide rails 26*a*, 26*b* in dependence upon the boards to be transferred therealong. Thus, when each two guide rails 25*a*, 26*a* (25*b*, 26*b*) is narrowed in width, the extra space is formed between the center side guide rails 26*a*, 26*b*. This extra space advantageously further separates the two boards transferred by the two board transfer devices 10*a*, 10*b*, so that the chance for the two component placing heads 43*a*, 43*b* to interfere with each other can be minimized more reliably.

In the embodiment exemplified in FIG. 24 for example, the program for controlling the operation of the component mounting operations is provided being designed to control the apparatus in such a way that the component placing device 40 mounts components simultaneously or alternately on two boards Sa, Sb transferred by the two board transfer devices 10*a*, 10*b* to respective component mounting positions, and that while either one of the two board transfer devices 10*a* (10*b*) is transferring a board Sa on which component mountings have been completed, or while either one the two board transfer devices 10*a* (10*b*) is being adjusted to alter the transfer way width thereof, at least one component placing head 43*a* (or 43*b*) mounts components intensively on the other board Sb at the other of the two board transfer devices 10*b* (10*a*). Accordingly, the efficiency in mounting the components on the other board Sb can be enhanced.

In the embodiment exemplified in FIGS. 8 and 25 for example, the program for controlling the operation of the component mounting apparatus is provided being designed to control the apparatus in such a way that the component placing device 40 mounts the components simultaneously or alternately on two boards Sa, Sb transferred by the two board transfer devices 10*a*, 10*b* to respective component mounting positions, and that while either one of the two component placing heads 43*a*(43*b*) is mounting the components on either one of the two boards Sa (Sb) within the predetermined interference risk zone Si which is close to the center portion between the two boards Sa, Sb, the other component placing head 43*b*(43*a*) mounts the components on the other of the two boards Sb (Sa) at the interference-free zone except for the predetermined interference risk zone Si. This advantageously ensures that the chance for the two component placing heads 43*a*, 43*b* to interfere with each other can be minimized and therefore that the efficiency in mounting the components on both of the boards Sa, Sb can be enhanced.

Figure 18:
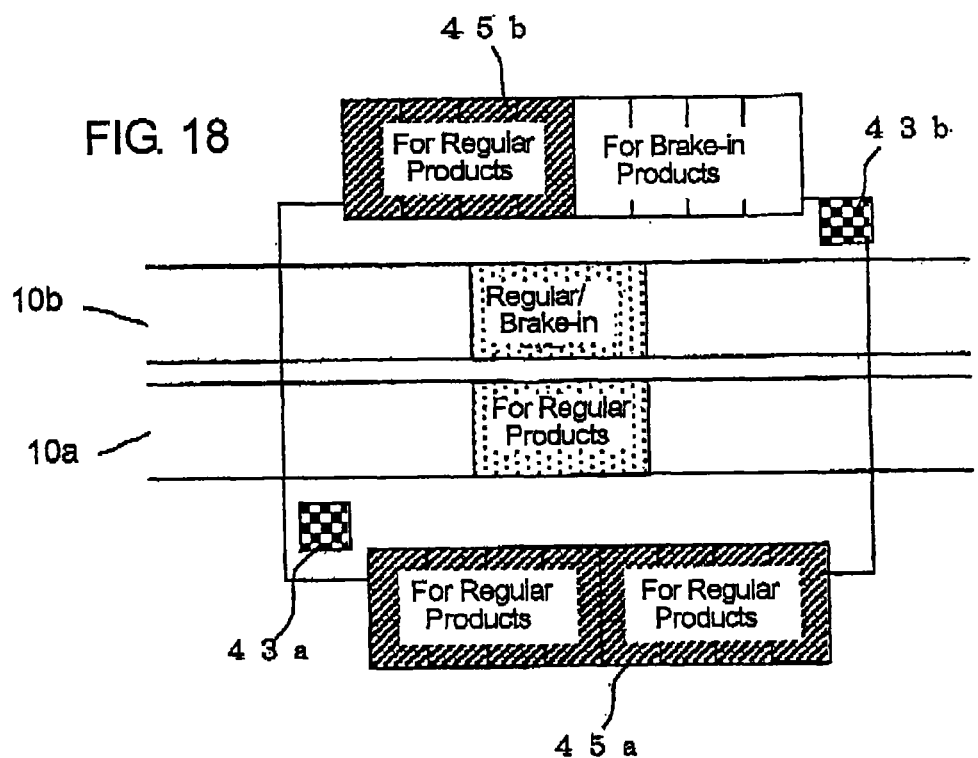
FIG. 18 is a rough plan view explaining the operation of the apparatus in the sixth embodiment.

In the embodiment exemplified in FIGS. 18 and 27 for example, of the two board transfer devices 10*a*, 10*b*, one of them 10*a* is set as regular type product transfer device for transferring the boards only for the regular type products (type-A), while the other transfer device 10*b* is set as break-in product transfer device for transferring the boards for break-in products (type-B) which are different in the board width from the regular type products (type-A). The program for controlling the operation of the component mounting apparatus which has been so set is provided to be designed to control the apparatus in such a way that in response to a production command for break-in products of a certain type (type-B) other than the regular type products (type-A), the other board transfer device 10*b* is operated to unload the board for the regular type products (type-A) therefrom while preventing another board for the regular type products (type-A) from being loaded thereto, a mounting program for controlling the mounting operations at the other board transfer device 10*b* is changed to another mounting program corresponding to the break-in products of the certain type (type-B), the other board transfer device 10*b* is adjusted to have a rail-to-rail width corresponding to the break-in products of the certain type (type-B), and the boards for the break-in products of the certain type (type-B) are successively loaded onto the other board transfer device 10*b* to have components mounted thereon. Thus, when the command for the production of the break-in products (type-B) is given during the production of the regular type products (type-A), both the two board transfer devices 10*a*, 10*b* are not required to be rearranged or prepared immediately, and instead, only the board transfer device 10*b* set for the break-in products (type-B) can be rearranged or prepared for the break-in products (type-B)

without being thrown into the state of disorder. This advantageously makes it possible to perform the rearrangement or preparation of the transfer device within a short time period and at low cost.

In the embodiment exemplified in FIGS. 18 and 19 for example, the program for controlling the operation of the component mounting apparatus is provided to be designed to control the apparatus as follows. That is, where the regular type product in production is to be changed from the first regular type product (type-A) to the second type product (type-B), a trial basis production of the second type product (type-B) is performed at the other transfer device 10*b* which has been set for the break-in products, while the component mountings are being continued at one of the transfer devices 10*a*. And, if the trial basis production does not give rise to any problem, the other board transfer device 10*b* is set for the regular type products, and the component mountings on the boards for the second type products (type-B) are then performed on a full-scale basis, in connection with which a setting alteration is executed to set the one board transfer device 10*a* as the break-in product transfer device. According to the program, when the command for the production of the break-in products (type-B) is given during the production of the regular type products (type-A), both the two board transfer devices 10*a*, 10*b* are not required to be rearranged or prepared immediately, and instead, only the board transfer device 10*b* set for the break-in products (type-B) can be rearranged or prepared for the break-in products (type-B) without being thrown into the state of disorder. In this way, any problem accompanied by the production of the second type products can be extracted prior to the full-scale basis production thereof without discontinuing the production operation by the component mounting apparatus. Therefore, the occurrence of poor quality after the starting of the full-scale basis production can be obviated, so that the change of the products from a certain kind of products to another kind of products can be made smoothly.

In the embodiment exemplified in FIG. 20 for example, the program for controlling the operation of the component mounting apparatus is provided to be designed to control the apparatus as follows. Where the products on which the component mountings are being performed at both of the two board transfer devices 10*a*, 10*b* are to be changed from the first type product (type-A) to the second type product (type-B), a trial basis production of the second type product (type-B) is performed at the other transfer device 10*b* while the component mountings on the first type products (type-A) are being continued at one of the transfer devices 10*a*. And, if the trial basis production does not give rise to any problem, the component mountings on the boards for the second type products (type-B) are then performed on the full-scale basis. Thereafter, if any problem does not result from the trial basis component mounting operations on the second type products (type B) at the one board transfer device 10*a*, the component mountings on the full-scale basis are initiated at the one board transfer device 10*a*. Therefore, any problem accompanied by the production of the second type products (type-B) can be extracted prior to the full-scale basis production thereof without discontinuing the production operation by the component mounting apparatus. Consequently, the occurrence of poor quality after the starting of the full-scale basis production can be obviated, so that the change of the products from a certain kind of products to another kind of products can be made smoothly.

In the embodiment exemplified in FIG. 21 for example, the program for controlling the operation of the component mounting apparatus is provided to be designed to control the apparatus as follows. That is, the two board transfer devices 10*a*, 10*b* for transferring the boards in respective directions parallel to each other guide the both sides of each board with two guide rails thereof. All the guide rails 25*a*, 26*a*, 25*b*, 26*b* are adjustable to be altered by the guide rail position adjusting means 30 (FIG. 2) in a direction perpendicular to the lengthwise or longitudinal direction thereof. In accordance with the program, the guide rail position adjusting means 30 is controlled in such a way that it positions the outside guide rails 25*a*, 25*b* at the side of the component supply devices 45*a*, 45*b*, to the positions closest to the component supply devices 45*a*, 45*b* and also positions the center side guide rails 26*a*, 26*b* in dependence upon the boards to be transferred therealong. Thus, when each two guide rails 25*a*, 26*a* (25*b*, 26*b*) is narrowed in width, the extra space is formed between the center side guide rails 26*a*, 26*b*. This extra space advantageously further separates the two boards transferred by the two board transfer devices 10*a*, 10*b*, so that the chance for the two component placing heads 43*a*, 43*b* to interfere with each other can be minimized more reliably.

In the embodiment exemplified in FIG. 22 for example, the component mounting system employs a component mounting apparatus which comprises two board transfer devices 10*a*, 10*b* for respectively transferring boards Sa, Sb, a component supply device 45*a* (or 45*b*) for supplying components of plural kinds to be mounted on the boards Sa, Sb, and a component placing device 40 for picking up the components supplied from the component supply device 45*a* (or 45*b*) to mount the picked-up components on the boards Sa, Sb. The system is operable selectively in the first and second production modes. In the first production mode, the component placing device 40 mounts components on two boards Sa, Sb which have been transferred by the two board transfer devices 10*a*, 10*b* to respective component mounting positions. In the second production mode, on the contrary, one of the two board transfer devices 10*a* is used as mounting conveyor where the component placing device 40 mounts components on the boards Sa, while the other board transfer device 10*b* is used as bypass conveyor by which the boards Sb unnecessary to have components mounted thereon are transferred to bypass the component mounting operations at the one board transfer device 10*a*. With this configuration, when a certain component mounting apparatus falls in difficulties in a production line with plural component mounting apparatus connected in series, the other transfer device 10*b* can be utilized to make the boards bypass the troubled apparatus and to send the boards to another component mounting apparatus at the downstream for component mounting operations thereon. Therefore, it does not occur that the production line falls in shutdown as a whole. Further, the boards which are small in the number of the components to be mounted thereon can be made to bypass any component mounting apparatus which does not perform the component mounting operations on the boards, so that the productivity of the boards can be further enhanced.

Figure 23:
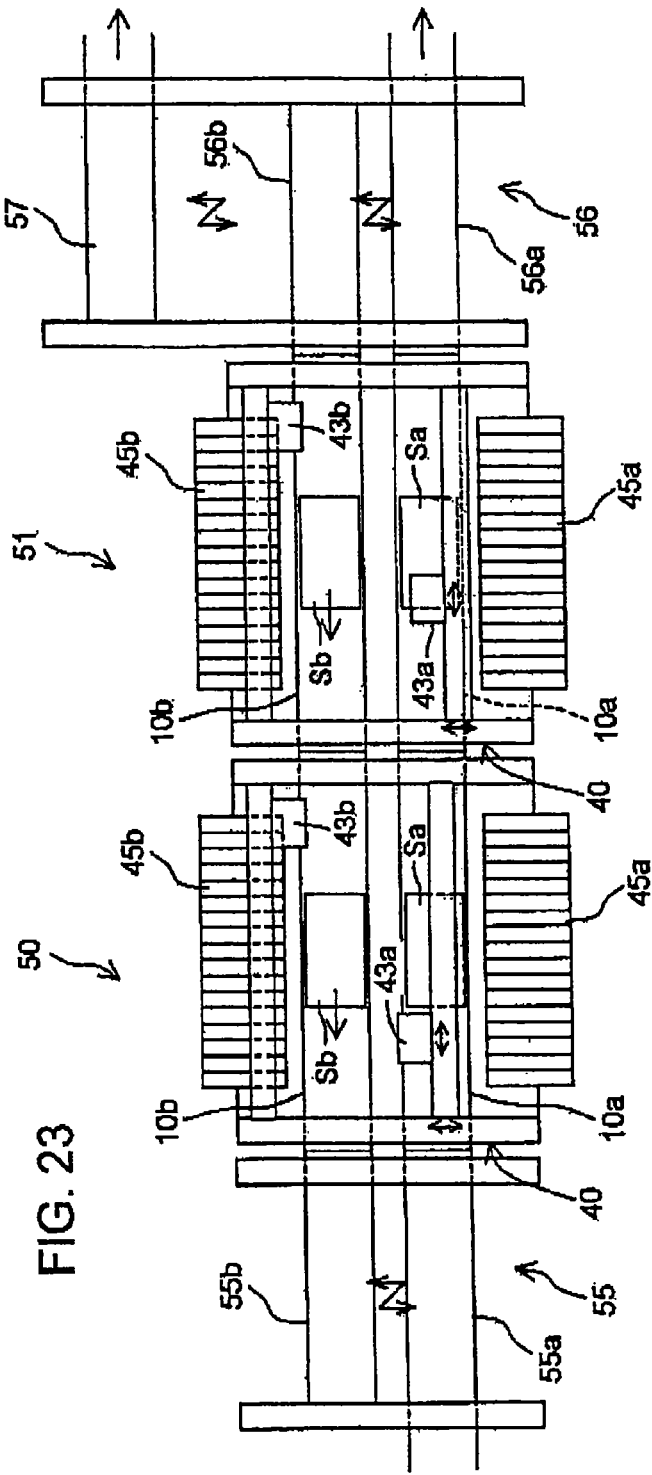
FIG. 23 is a rough plan view explaining the operation of an electronic component mounting system in the tenth embodiment according to the present invention.

In the embodiment exemplified in FIG. 23 for example, the component mounting system employs a component mounting apparatus which comprises two board transfer devices 10*a*, 10*b* for respectively transferring boards Sa, Sb, a component supply device 45*a* (or 45*b*) for supplying components of plural kinds to be mounted on the boards Sa, Sb, and a component placing device 40 for picking up the components supplied from the component supply device 45*a* (or 45*b*) to mount the picked-up components on the boards Sa, Sb. The system is operable selectively in the first and second production modes. In the first production mode, the component placing device 40 mounts components on two boards Sa, Sb which have been transferred by the two board transfer devices 10a, 10b to respective component mounting positions. In the second production mode, on the contrary, one of the two board transfer devices 10a is used as mounting conveyor where the component placing device 40 mounts components on the board Sa thereat, while the other board transfer device 10b is used as return conveyor by which the boards required to have components remounted thereon are returned to the loading side of the component mounting apparatus. With this configuration, the board Sa which has been unloaded by the one board transfer device 10a from the component mounting apparatus is inspected at the shifting device 56 with the inspection station. If the board Sa has a defect, but is curable to have missing or omitted components remounted thereon, it is shifted onto the other board transfer device 10b to be returned to the loading side. Then, the defective, but curable board Sa is loaded by the shifting device 55 onto the one board transfer device 10a, and then, the missing components can automatically be remounted on the board Sa. Accordingly, because it becomes unnecessary to remount the omitted or missing components after the production of all the boards of the designated kind or type has been completed in the production line, the production control coping with the missing of components can be simplified.

In the embodiment exemplified also in FIG. 23 for example, the board Sa which has been unloaded by one of the board transfer device 10a from the component mounting apparatus is inspected at the shifting device 56 with the inspection station. If the board Sa has a defect, but is curable to have missing or omitted components remounted thereon, it is shifted onto the other board transfer device 10b to be returned to the loading side. Then, the defective, but curable board Sa is shifted by the shifting device 55 onto the one board transfer device 10a, so that the missing components can automatically be remounted on the board Sa.

Obviously, numerous modifications and variations of the present invention are possible in light of the above teachings. It is therefore to be understood that within the scope of the appended claims, the present invention may be practiced otherwise than as specifically described herein.

What is claimed is:

1. A component mounting apparatus comprising:
two board transfer devices arranged in parallel relation with each other and each configured to transfer boards in a first direction, each of the board transfer devices being adjustable to alter the transfer way width thereof in a second direction perpendicular to the first direction;
component supply means for supplying plural kinds of components to be mounted on the boards;
a component placing device including component placing head means for picking up the components supplied from the component supply means to mount the picked-up components on the boards and head moving means for moving the component placing head means in at least two directions parallel to a surface of the board;
setting means for setting the two board transfer devices to transfer first type product boards or setting one of the two board transfer devices to transfer the first type product boards and the other board transfer device to transfer second type product boards, the first type product boards differing from the second type product boards in kind; and
a controller that stores first and second mounting programs for use in mounting operations on the first type product boards and the second type product boards and that is configured:

(a) in response to a first command to produce a predetermined number of the first type product boards and until the production of the second type product is instructed, to control the two board transfer devices and the component placing device so that component mountings on the first type product boards are performed on the two board transfer devices in accordance with the first mounting program for the first type product boards; and
(b) while the predetermined number of the first type product boards are being produced on both of the first and second board transfer devices in response to the first command, when the production of the second type product boards is instructed in a second command, to unload a first type product board from the other board transfer device, to adjust the transfer way width of the other board transfer device to the width of the second type product boards, and to control the other board transfer device and the component placing device so that component mountings on the second type product boards are performed on the other board transfer device in accordance with the second mounting program for the second type product boards;
wherein the controller continues controlling the production of the first type product boards on the one board transfer device while controlling the production of the second type product boards on the other board transfer device.

2. The apparatus in claim 1, wherein:
the component supply means includes two component supply devices;
the component placing head means includes two component placing heads and two head moving mechanisms for respectively moving the two component placing heads independently of each other; and
the two board transfer devices includes respective pairs of guide rails of which guide rails juxtaposed on the inside are provided adjustably in a direction orthogonal to the first direction for adjustment of the width of each pair of guide rails.

3. The apparatus in claim 2, wherein:
while either one of the two board transfer devices is transferring one of the first and second type boards, or while either one of the two board transfer devices is being adjusted to alter the transfer way width thereof, the mounting of the components on the other of the first and the second type boards at the other of the two board transfer devices is performed by both of the two component placing heads.

4. The apparatus of claim 1, wherein:
the controller stores a mounting program including the first and second mounting programs; and
the controller that operates in accordance with the mounting program is configured to obviate the situation that the first and second board transfer devices are both being operated at the same time when the first type product boards are being produced on both of the first and second board transfer devices and when the first type product boards and the second type product boards are being produced respectively on the first and second board transfer devices.

5. The apparatus in claim 1, wherein:
when the production of the second type product boards is instructed in the second command, the other board transfer device unloads the first type product board thereon immediately such that the mounting of all the components on the first type product board is not completed.

6. The apparatus in claim 1, wherein:
when the production of the second type product boards is instructed in the second command, the other board transfer device unloads the first type product board thereon upon completion of the mounting of all the components on the first type product board.

* * * * *